(12) United States Patent
Pirovano et al.

(10) Patent No.: US 10,672,981 B2
(45) Date of Patent: Jun. 2, 2020

(54) MEMORY CELLS WITH ASYMMETRICAL ELECTRODE INTERFACES

(71) Applicant: Micron Technology, Inc., Boise, ID (US)

(72) Inventors: Agostino Pirovano, Milan (IT); Kolya Yastrebenetsky, Boise, ID (US); Anna Maria Conti, Milan (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/706,358

(22) Filed: Dec. 6, 2019

(65) Prior Publication Data

US 2020/0119273 A1 Apr. 16, 2020

Related U.S. Application Data

(62) Division of application No. 15/893,108, filed on Feb. 9, 2018, now Pat. No. 10,541,364.

(51) Int. Cl.
*H01L 45/00* (2006.01)
*G11C 13/00* (2006.01)
*H01L 27/24* (2006.01)

(52) U.S. Cl.
CPC ...... *H01L 45/1266* (2013.01); *G11C 13/0004* (2013.01); *G11C 13/004* (2013.01); *G11C 13/0069* (2013.01); *G11C 13/0097* (2013.01); *H01L 27/2463* (2013.01); *H01L 45/06* (2013.01); *H01L 45/08* (2013.01); *H01L 45/1233* (2013.01); *H01L 45/1273* (2013.01); *H01L 45/141* (2013.01); *H01L 45/142* (2013.01); *H01L 45/143* (2013.01); *H01L 45/144* (2013.01); *H01L 45/16* (2013.01); *H01L 45/1675* (2013.01); *G11C 2013/005* (2013.01); *G11C 2013/009* (2013.01);
(Continued)

(58) Field of Classification Search
None
See application file for complete search history.

(56) References Cited

U.S. PATENT DOCUMENTS 7,049,652 B2  5/2006  Mokhlesi et al.
7,550,313 B2  6/2009  Arnold et al.
(Continued)

FOREIGN PATENT DOCUMENTS

KR   20090077232 A   7/2009
KR   20150085155 A   7/2015

OTHER PUBLICATIONS

IPO, "Office Action," issued in connection with ROC (Taiwan) Patent Application No. 107114369, dated Apr. 19, 2019 (9 pages).
(Continued)

*Primary Examiner* — Mounir S Amer
(74) *Attorney, Agent, or Firm* — Holland & Hart LLP

(57) ABSTRACT

Methods, systems, and devices for memory cells with asymmetrical electrode interfaces are described. A memory cell with asymmetrical electrode interfaces may mitigate shorts in adjacent word lines, which may be leveraged for accurately reading a stored value of the memory cell. The memory device may include a self-selecting memory component with a top surface area in contact with a top electrode and a bottom surface area in contact with a bottom electrode, where the top surface area in contact with the top electrode is a different size than the bottom surface area in contact with the bottom electrode.

20 Claims, 13 Drawing Sheets

(52) U.S. Cl.
CPC ............... *G11C 2013/0045* (2013.01); *G11C 2013/0078* (2013.01); *G11C 2013/0092* (2013.01); *G11C 2213/13* (2013.01); *G11C 2213/52* (2013.01); *G11C 2213/73* (2013.01)

(56) References Cited

U.S. PATENT DOCUMENTS

| | | |
|---|---|---|
| 8,153,488 B2 | 4/2012 | Nishitani et al. |
| 8,222,677 B2 | 7/2012 | Baba et al. |
| 8,847,186 B2 | 9/2014 | Redaelli et al. |
| 9,257,431 B2 | 2/2016 | Ravasio et al. |
| 9,337,422 B2 | 5/2016 | Cheong et al. |
| 9,640,588 B2 | 5/2017 | Sciarrillo et al. |
| 2006/0157683 A1 | 7/2006 | Scheuerlein |
| 2007/0010082 A1 | 1/2007 | Pinnow et al. |
| 2007/0063180 A1 | 3/2007 | Asano et al. |
| 2007/0097739 A1 | 5/2007 | Happ et al. |
| 2007/0238225 A1 | 10/2007 | Wicker |
| 2007/0246782 A1 | 10/2007 | Philipp et al. |
| 2008/0019170 A1 | 1/2008 | Happ et al. |
| 2008/0044632 A1 | 2/2008 | Liu et al. |
| 2009/0020739 A1 | 1/2009 | Arnold et al. |
| 2010/0032725 A1 | 2/2010 | Baba et al. |
| 2010/0044664 A1 | 2/2010 | Liu |
| 2011/0032753 A1 | 2/2011 | An et al. |
| 2011/0155984 A1 | 6/2011 | Redaelli et al. |
| 2012/0069645 A1 | 3/2012 | Goux et al. |
| 2012/0282752 A1 | 11/2012 | Lee et al. |
| 2014/0034892 A1 | 2/2014 | Erbetta et al. |
| 2014/0256110 A1 | 9/2014 | Lung et al. |
| 2014/0319442 A1 | 10/2014 | Hayashi |
| 2015/0028280 A1 | 1/2015 | Sciarrillo et al. |
| 2015/0090952 A1 | 4/2015 | Huang |
| 2015/0200368 A1 | 7/2015 | Lee et al. |
| 2015/0255507 A1 | 9/2015 | Pakala et al. |
| 2015/0372227 A1 | 12/2015 | Liu |
| 2016/0020389 A1 | 1/2016 | Ratnam et al. |
| 2017/0040533 A1 | 2/2017 | Marsh et al. |
| 2017/0117467 A1 | 4/2017 | Chang et al. |
| 2017/0125097 A1 | 5/2017 | Tortorelli et al. |
| 2017/0207387 A1 | 7/2017 | Yang et al. |
| 2017/0346003 A1 | 11/2017 | Liu |
| 2019/0058109 A1 | 2/2019 | Chen et al. |

OTHER PUBLICATIONS

IPO, "Office Action," issued in connection with ROC (Taiwan) Patent Application No. 108103433, dated Oct. 17, 2019 (6 pages).

ISA/KR, International Search Report and Written Opinion of the International Searching Authority, Int'l Appl. No. PCT/US2019/015671, dated May 14, 2019, Korean Intellectual Property Office, Seo-gu, Daejeon, Republic of Korea,15 pgs.

ISA/KR, International Search Report and Written Opinion of the International Searching Authority, Int'l Appl. No. PCT/US2019/015678, dated May 15, 2019, Korean Intellectual Property Office, Seo-gu, Daejeon, Republic of Korea,15 pgs.

ISA/KR, International Search Report and Written Opinion of the International Searching Authority, Int'l Appl. No. PCT/US2019/015683, dated May 15, 2019, Korean Intellectual Property Office, Seo-gu, Daejeon, Republic of Korea,13 pgs.

ISA/KR, International Search Report of the International Searching Authority, Int'l Appl. No. PCT/US2018/028391, dated Aug. 9, 2018, Korean Intellectual Property Office, Seo-gu, Daejeon, Republic of Korea, 14pgs.

U.S. Appl. No. 15/582,329, filed Apr. 28, 2017.
U.S. Appl. No. 15/621,939, filed Nov. 4, 2015.

MEMORY CELLS WITH ASYMMETRICAL ELECTRODE INTERFACES

CROSS REFERENCE

The present Application for Patent is a divisional of and claims priority to and the benefit of U.S. patent application Ser. No. 15/893,108 by Pirovano et al., entitled "MEMORY CELLS WITH ASYMMETRICAL ELECTRODE INTERFACES," filed Feb. 9, 2018, assigned to the assignee hereof, and is expressly incorporated by reference in its entirety herein.

BACKGROUND

The following relates generally to self-selecting memory cells and more specifically to memory cells with asymmetrical electrode interfaces.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

Some types of memory devices may use variations in resistance across a cell to program and sense different logic states. For example, in a self-selecting memory cell a logic state may be stored based on a distribution of charges and/or ions and/or elements within the memory cell. The manner in which a cell is programmed may affect the distribution of various materials that compose the cell, which may affect the ion migration of the cell, which, in turn, may affect a threshold voltage of the cell. The threshold voltage may be related to or indicative of the logic state of the cell. Small variations in threshold voltages between different logic states may therefore affect the accuracy with which cells may be read.

DETAILED DESCRIPTION

Figure 1:
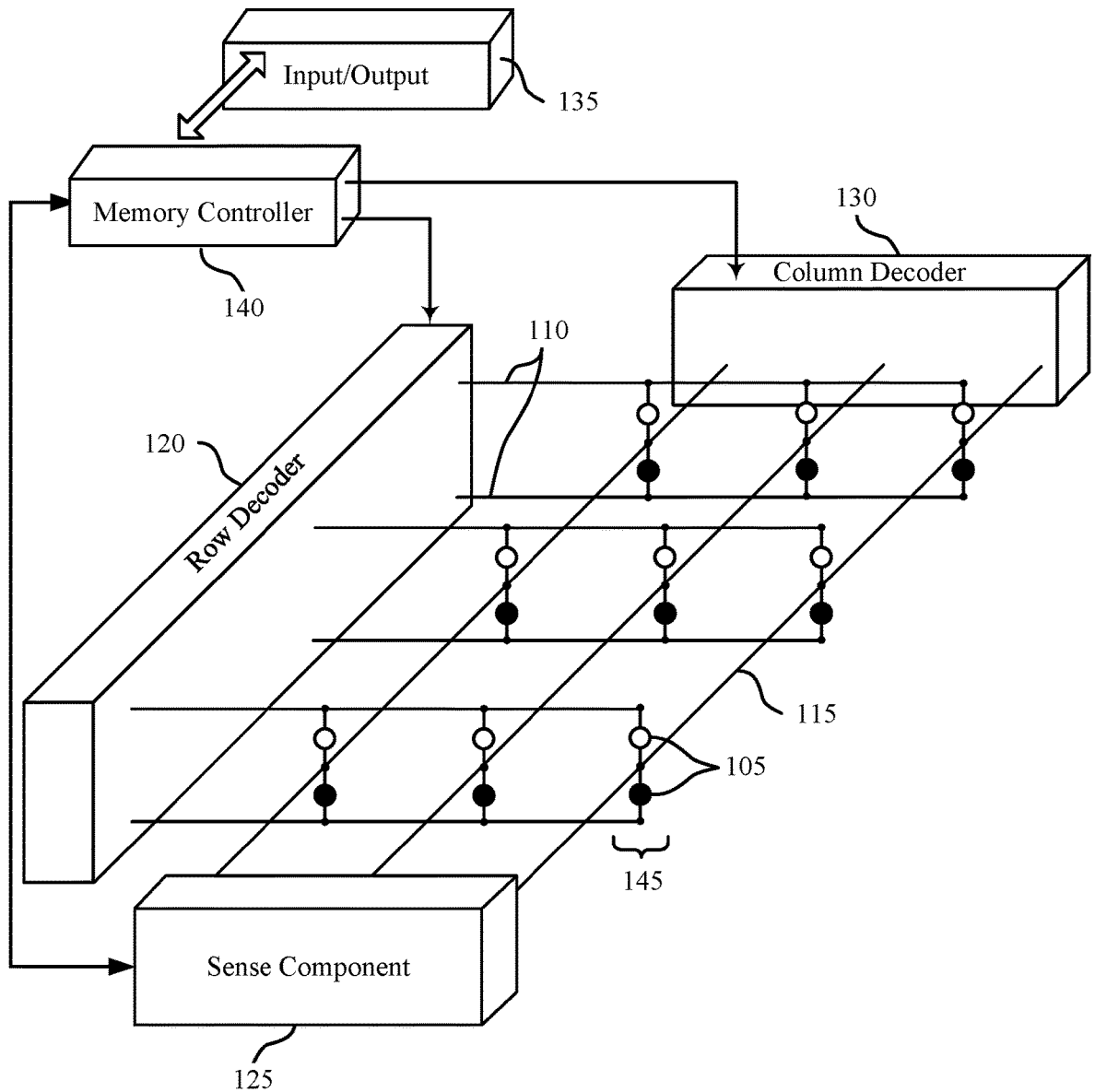
FIG. 1 illustrates an example memory array that supports memory cells with asymmetrical electrode interfaces in accordance with examples of the present disclosure.

A self-selecting memory cell with asymmetrical electrode interfaces may affect a distribution of ions in a memory cell. As the distribution of ions in the memory cell changes, it may affect a threshold voltage of the memory cell and may be used to store different programmed states. For example, applying a particular programming pulse may cause ions to crowd at or near a particular electrode of a cell. Asymmetrical electrode interfaces may enhance the sensing window for the cell, which may result in more accurate sensing compared to cells with symmetric electrode interfaces. When a self-selecting memory cell is programmed, elements within the cell separate, causing ion migration. Ions may migrate towards a particular electrode, depending on the polarity of the programming pulse applied to the cell.

Increased sensing reliability in a self-selecting memory device may be realized using asymmetrical electrode interfaces with a memory storage element of the self-selecting memory cell. Each memory cell may be configured such that, when programmed, ions within the cell migrate towards one electrode. Due to asymmetrical electrode interfaces with the self-selecting memory component, a greater density of ions may build up at or near one electrode. This may create a region with a high density of ions and a region with a low density of ions within the cell. Depending on the polarity of the programming pulse applied to the memory cell, this concentration of ions may represent a logic "1" or logic "0" state.

A self-selecting memory device with asymmetrical electrode interfaces may be formed by varying a size of a bottom electrode and/or a top electrode in contact with the self-selecting memory component. The area of a top surface of the self-selecting memory component contacting the top electrode may be less than the area of a bottom surface of the self-selecting memory component contacting the bottom electrode from the perspective of the word line and/or digit line directions. In some examples, a dielectric liner may be in contact with side surfaces of the top electrode in the word line and digit line directions to achieve the asymmetrical electrode interfaces.

Alternatively, the area of a top surface of the self-selecting memory component contacting the top electrode may be greater than the area of a bottom surface of the self-selecting memory component contacting the bottom electrode from the perspective of the word line and digit line directions. In some examples, a dielectric liner may be in contact with side surfaces of the top electrode and the self-selecting memory component in the word line and digit line directions to achieve the asymmetrical electrode interfaces. In some examples, a dielectric liner may be in contact with side surfaces of the top electrode and the self-selecting memory component in the word line direction to achieve the asymmetrical electrode interfaces.

A self-selecting memory device with asymmetrical electrode interfaces may be formed using examples of etching techniques. For example, the self-selecting memory device may be partially etched in the word line direction through the top electrode. A dielectric liner may then be deposited to be in contact with side surfaces of the top electrode using in-situ or ex-situ techniques. The dielectric liner may serve as a spacer for subsequent etching steps in order to allow for wider dimensions of the self-selecting memory component than dimensions of the top electrode. Therefore, the area of electrode interface between the top electrode and the self-selecting memory component may be less than the area of electrode interface between the bottom electrode and the self-selecting memory component.

Alternatively, a self-selecting memory device with asymmetrical electrode interfaces may be formed using other examples of etching techniques. For example, the self-selecting memory device may be partially etched in the word line direction through the top electrode and the self-selecting memory component. A dielectric liner may then be deposited to be in contact with side surfaces of the top electrode and the self-selecting memory component using in-situ or ex-situ techniques. The dielectric liner may serve as a spacer for subsequent etching steps in order to allow for wider dimensions of the self-selecting memory component than dimensions of the bottom electrode. Therefore, the area of electrode interface between the top electrode and the self-selecting memory component may be greater than the area of electrode interface between the bottom electrode and the self-selecting memory component.

Features of the disclosure introduced above are further described below in the context of a memory array. Self-selecting memory cells with asymmetrical electrode interfaces are illustrated and depicted in the context of a cross-point architecture. These and other features of the disclosure are further illustrated by and described with reference to apparatus diagrams, system diagrams, and flowcharts that relate to memory cells with asymmetrical electrode interfaces.

FIG. 1 illustrates an example memory array 100 that supports memory cells with asymmetrical electrode interfaces in accordance with various examples of the present disclosure. Memory array 100 may also be referred to as an electronic memory apparatus. Memory array 100 includes memory cells 105 that are programmable to store different states. Each memory cell 105 may be programmable to store two states, denoted a logic "0" and a logic "1." In some cases, memory cell 105 is configured to store more than two logic states.

A memory cell 105 may include a chalcogenide material, which may be referred to as a self-selecting memory component, that has a variable and configurable threshold voltage or electrical resistance, or both, that is representative of the logic states. In some examples, a threshold voltage of a cell changes depending on a polarity of a pulse used to program the cell. For example, a self-selecting memory cell programmed with one polarity may have certain resistive properties and thus one threshold voltage. And that self-selecting memory cell may be programmed with a different polarity that may result in different resistive properties of the cell and thus a different threshold voltage. As discussed above, when a self-selecting memory cell is programmed, elements within the cell may separate, causing redistribution of charges and/or ions and/or elements within the memory cell 105. As used herein, the term "ions" may relate to any of these possibilities. Ions may migrate towards a particular electrode, depending on the given cell's polarity. For example, in a self-selecting memory cell, ions may migrate towards the negative electrode. The memory cell may then be read by applying a voltage across the cell to sense which electrode ions have migrated towards. In some examples, cations may migrate towards one of the electrodes while anions may migrate towards the other of the electrodes.

In some examples, cell programming may exploit the crystalline structure or atomic configuration to achieve different logic states. For example, a material with a crystalline or an amorphous atomic configuration may have different electrical resistances. A crystalline state may have a low electrical resistance and may, in some cases, be referred to as the "set" state. An amorphous state may have a high electrical resistance and may be referred to as the "reset" state. A voltage applied to the memory cell 105 may thus result in different currents depending on whether the material is in a crystalline or an amorphous state, and the magnitude of the resulting current may be used to determine the logic state stored by memory cell 105.

In some cases, a material in the amorphous, or reset, state may have a threshold voltage associated with it—that is, current flows after the threshold voltage is exceed. Thus, if the applied voltage is less than the threshold voltage, no current may flow if the memory element is in the reset state; if the memory element is in the set state, it may not have a threshold voltage (i.e., a threshold voltage of zero) and, thus, a current may flow in response to the applied voltage. In other cases, the memory cell 105 may have a combination of crystalline and amorphous areas that may result in intermediate resistances, which may correspond to different logic states (i.e., states other than logic 1 or logic 0) and may allow memory cells 105 to store more than two different logic states. As discussed below, the logic state of a memory cell 105 may be set by heating, including melting, the memory element.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145.

Each row of memory cells 105 is connected to an access line 110 and an access line 115. Access lines 110 may also be known as word lines 110, and bit lines 115, respectively. Bit lines 115 may also be known digit lines 115. References to word lines and bit lines, or their analogues, are interchangeable without loss of understanding or operation. Word lines 110 and bit lines 115 may be substantially perpendicular to one another to create an array. The two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Other configurations may be possible; for example, memory cell 105 may include asymmetrical electrode interfaces with the memory storage element.

In general, one memory cell 105 may be located at the intersection of two conductive lines such as a word line 110 and a digit line 115. This intersection may be referred to as a memory cell's address. A target memory cell 105 may be a memory cell 105 located at the intersection of an energized word line 110 and digit line 115; that is, a word line 110 and digit line 115 may be energized in order to read or write a memory cell 105 at their intersection. Other memory cells 105 that are in electronic communication with (e.g., connected to) the same word line 110 or digit line 115 may be referred to as untargeted memory cells 105.

As discussed above, electrodes may be coupled to a memory cell 105 and a word line 110 or a digit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting a word line 110 and digit line 115, which may include applying a voltage or a current to the respective line. Word lines 110 and bit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Upon selecting a memory cell 105, a migration of, for example, ions may be leveraged to set a logic state of the cell.

To read the cell, a voltage may be applied across memory cell 105 and the resulting current or the threshold voltage at which current begins to flow may be representative of a logic "1" or a logic "0" state. The crowding of ions at one or the other ends of self-selecting memory component may affect the resistivity and/or the threshold voltage, resulting in greater distinctions in cell response between logic states.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Thus, by activating a word line 110 and a digit line 115, a memory cell 105 may be accessed.

Upon accessing, a memory cell 105 may be read, or sensed, by sense component 125. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a voltage may be applied to a memory cell 105 (using the corresponding word line 110 and digit line 115) and the magnitude of the resulting current may depend on the electrical resistance of the memory cell 105. Likewise, a current may be applied to a memory cell 105 and the magnitude of the voltage to create the current may depend on the electrical resistance of the memory cell 105. Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or, sense component 125 may be connected to or in electronic communication with column decoder 130 or row decoder 120.

A memory cell 105 may be programmed, or written, by similarly activating the relevant word line 110 and digit line 115—i.e., a logic value may be stored in the memory cell 105. Column decoder 130 or row decoder 120 may accept data, for example input/output 135, to be written to the memory cells 105. In the case of phase change memory or self-selecting memory, a memory cell 105 may be written by heating the self-selecting memory component, for example, by passing a current through the self-selecting memory component. Depending on the logic state written to memory cell 105—e.g., logic "1" or logic "0"—ions may crowd at or near a particular electrode. For example, dependent on the polarity of memory cell 105, ion crowding at or near a first electrode may result in a first threshold voltage representative of a logic "1" state and ion crowding at or near a second electrode may result in a second threshold voltage, different from the first, representative of a logic "0" state. The first threshold voltage and second threshold voltage may, for example, be determined during a read operation performed in a predetermined polarity. The difference between the first and second threshold voltages may be more pronounced in memory cells with asymmetrical electrode interfaces, including those described with reference to FIGS. 3-8.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as PCM and/or self-selecting memory, accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile PCM and/or self-selecting memory cells may have beneficial properties that may result in improved performance relative to other memory architectures. For example, PCM and/or self-selecting memory may offer comparable read/write speeds as DRAM but may be non-volatile and allow for increased cell density.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105.

In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
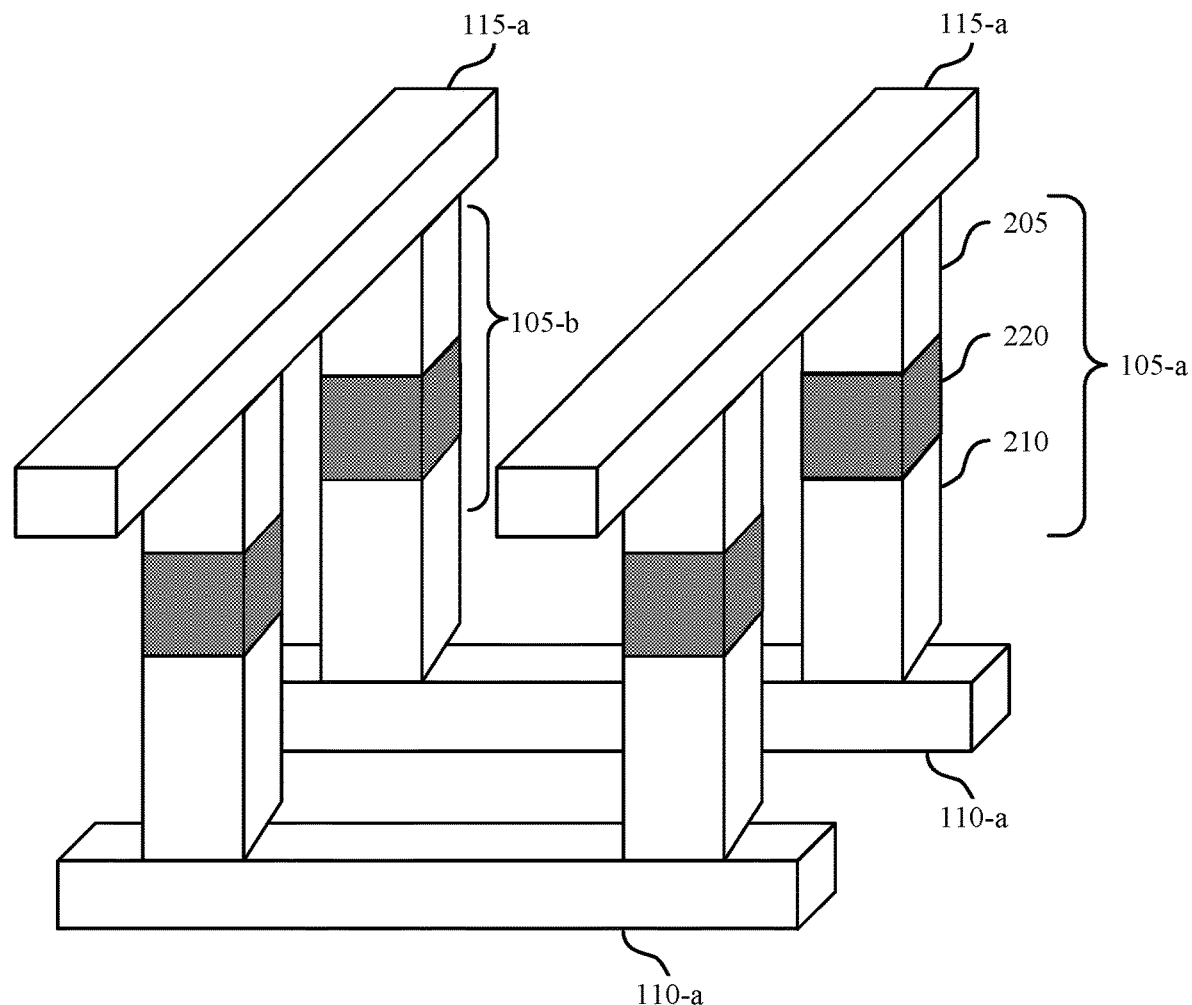
FIG. 2 illustrates an example memory array that memory cells with asymmetrical electrode interfaces profiles in accordance with examples of the present disclosure.

FIG. 2 illustrates an example memory array 200 that supports reading and writing non-volatile memory cells and programming enhancement in memory cells in accordance with various examples of the present disclosure. Memory array 200 may be an example of memory array 100 with reference to FIG. 1.

Memory array 200 may include memory cell 105-*a*, memory cell 105-*b*, word line 110-*a*, and digit line 115-*a*, which may be examples of a memory cell 105, word line 110, and digit line 115, as described with reference to FIG. 1. Memory cell 105-*a* may include electrode 205 (e.g., top electrode), electrode 210 (e.g., a bottom electrode), and self-selecting memory component 220. The logic state of memory cell 105-*a* may be based on at least one characteristic of self-selecting memory component 220. Memory cell 105-*b* may include a top electrode, bottom electrode, and self-selecting memory component similar to memory cell 105-*a*. some cases, a 3D memory array may be formed by stacking multiple memory arrays 200 on one another. The two stacked arrays may, in some examples, have common conductive lines so each level may share word line 110-*a* or digit line 115-*a*. Memory cell 105-*a* may depict a target memory cell—i.e., a target of a sensing operation, as described elsewhere herein.

The architecture of memory array 200 may be referred to as a cross-point architecture. It may also be referred to as a pillar structure. For example, as shown in FIG. 2, a pillar may be in contact with a first conductive line (e.g., access line such as word line 110-*a*) and a second conductive line (e.g., access line such as digit line 115-*a*). The pillar may comprise memory cell 105-*a*, where memory cell 105-*a* includes a first electrode (e.g., top electrode 205), self-selecting memory component 220, and a second electrode (e.g., bottom electrode 210). Memory cell 105-*a* may have asymmetrical electrode interfaces (including those described with reference to FIGS. 3-8). The asymmetrical electrode interfaces may cause ion crowding at the top electrode 205 or bottom electrode 210, depending on the polarity of memory cell 105-*a*. Ion crowding at top electrode 205 or bottom electrode 210 may allow for more-accurate sensing of memory cell 105-*a*, as described above. In addition, the asymmetrical electrode interfaces may mitigate shorts between adjacent word lines The cross-point or pillar architecture depicted in FIG. 2 may offer relatively high-density data storage with lower production costs compared to other memory architectures. For example, the cross-point architecture may have memory cells with a reduced area and thus an increased memory cell density compared to other architectures. For example, the architecture may have a $4F^2$ memory cell area, where F is the smallest feature size, compared to other architectures with a $6F^2$ memory cell area, such as those with a three-terminal selection. For example, DRAM may use a transistor, which is a three-terminal device, as the selection component for each memory cell and may have a larger memory cell area compared to the pillar architecture.

In some examples, memory array 200 may be operated using a positive voltage source and the magnitude of an intermediary voltage is between the magnitude of the positive voltage source and a virtual ground. In some examples, both bit line access voltage and word line access voltage are maintained at an intermediary voltage prior to an access operation of memory cell 105-*a*. And during an access operation, bit line access voltage may be increased (e.g., to a positive supply rail) while word line access voltage may be simultaneously decreased (e.g., to a virtual ground), generating a net voltage across memory cell 105-*a*. The threshold voltage at which current begins to flow through memory cell 105-*a* as a result of applying a voltage across memory cell 105-*a* may be a function of ion migration towards top electrode 205 or bottom electrode 210, which in turn may vary with the shape of self-selecting memory component 220 and the asymmetrical electrode interfaces between self-selecting memory component 220 and top electrode 205 and bottom electrode 210.

Self-selecting memory component 220 may, in some cases, be connected in series between a first conductive line and a second conductive line, for example, between word line 110-*a* and digit line 115-*a*. For example, as depicted in FIG. 2, self-selecting memory component 220 may be located between top electrode 205 and bottom electrode 210; thus, self-selecting memory component 220 may be located in series between digit line 115-*a* and word line 110-*a*. Other configurations are possible. As mentioned above, self-selecting memory component 220 may have a threshold voltage such that a current flows through self-selecting memory component 220 when the threshold voltage is met or exceeded. The threshold voltage may depend on the programming of memory cell 105-*a* and the asymmetrical electrode interfaces between self-selecting memory component 220 and top electrode 205 and bottom electrode 210.

Self-selecting memory component 220 may be arranged in a series configuration between the word line 110-*a* and digit line 115-*a*. Self-selecting memory component 220 may include a chalcogenide glass comprising selenium. In some examples, self-selecting memory component 220 comprises a composition of at least one of selenium, arsenic (As), tellurium (Te), silicon (Si), germanium (Ge), or antimony (Sb). When a voltage is applied across the self-selecting memory component 220 (or when there is a voltage difference between top electrode 205 and bottom electrode 210, ions may migrate toward one or the other electrode. Self-selecting memory component 220 may also serve as a selector device. This type of memory architecture may be referred to as self-selecting memory.

Figure 3:
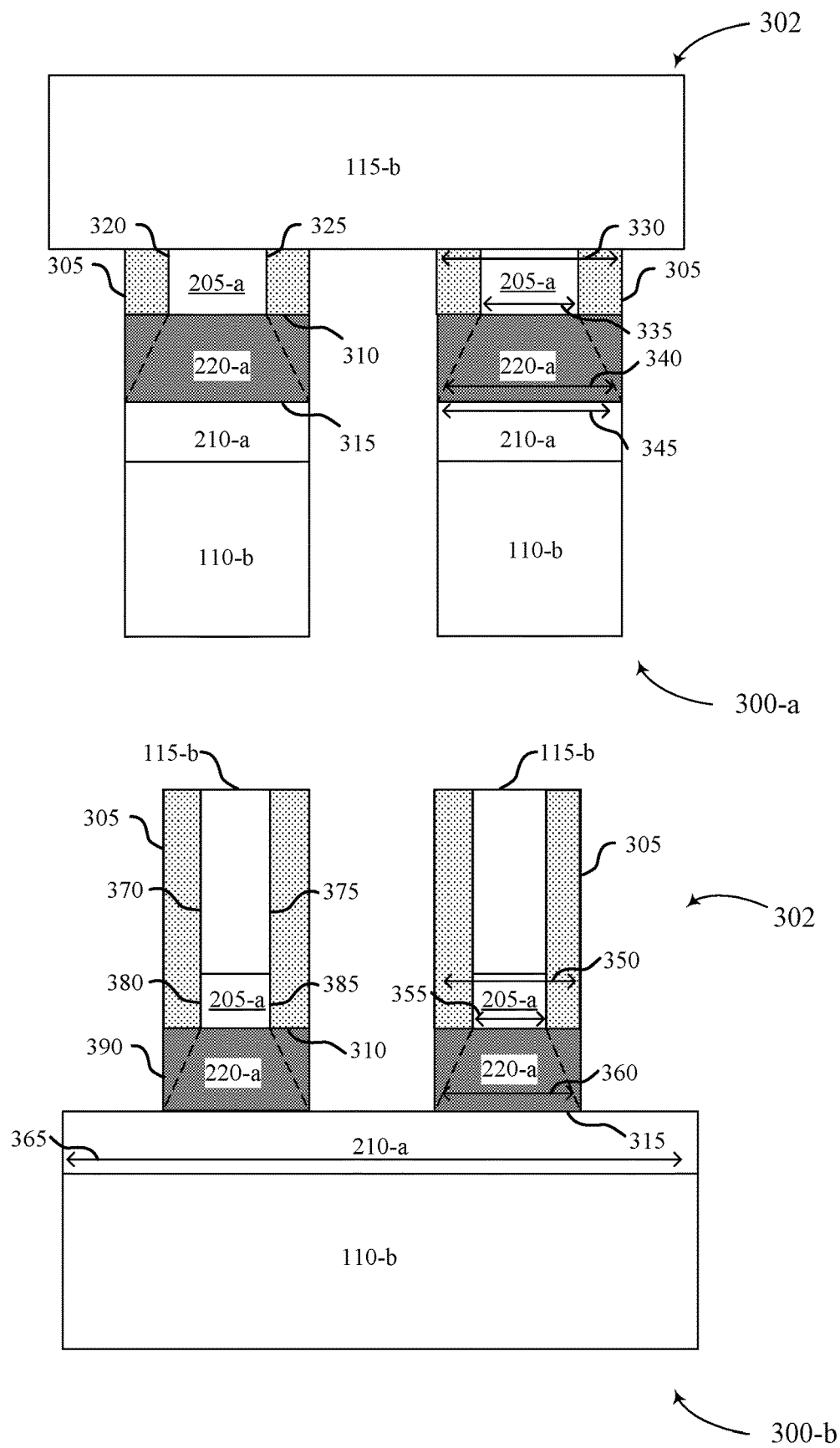
FIG. 3 illustrates example cross-sectional views of a memory device that supports memory cells with asymmetrical electrode interfaces in accordance with examples of the present disclosure.

FIG. 3 illustrates example cross-sectional views 300-*a* and 300-*b* of a memory device 302 that supports memory cells with asymmetrical electrode interfaces in accordance with examples of the present disclosure. Self-selecting memory component 220-*a* may have asymmetric electrode interfaces with top electrode 205-*a* and bottom electrode 210-*a* in a word line direction (e.g., first direction) and/or digit line direction (e.g., second direction). For example, a length of the top electrode 205-*a* may be less than a length of the bottom electrode 210-*a*, thereby causing the top electrode interface with the self-selecting memory component 220-*a* to be smaller than the bottom electrode interface with the self-selected memory component 220-*a*. Top electrode 205-*a* may be coupled to digit line 115-*b* and bottom electrode 210-*a* may be coupled to word line 110-*b*.

Self-selecting memory component 220-*a* includes top surface 310 and bottom surface 315 opposite the top surface 310. Self-selecting memory component 220-*a* may also include length 340 in the word line direction and length 360 in the digit line direction. Length 340 and length 360 may determine the dimensions and area of top surface 310 and bottom surface 315. In some cases, length 340 may be equal when measured along top surface 310 and bottom surface 315 in the word line direction. That is, the cross-section of self-selecting memory component 220-*a* may be a rectangle in the word line direction and illustrate a straight profile. In some cases, length 360 may be equal when measured along top surface 310 and bottom surface 315 in the digit line direction. That is, the cross-section of self-selecting memory component 220-*a* may be a rectangle in the digit line direction and illustrate a straight profile. The area of top surface 310 and the area of bottom surface 315 may also be equal.

In some cases, length 340 may be unequal when measured along top surface 310 and bottom surface 315 in the word line direction. That is, the cross-section of self-selecting memory component 220-*a* may be a trapezoid or an inverted trapezoid and illustrate a curved or slanted geometric profile (e.g., a tapered profile or a stepped profile). In some cases, length 360 may be unequal when measured along top surface 310 and bottom surface 315 in the digit line direction. That is, the cross-section of self-selecting memory component 220-*a* may be a trapezoid or an inverted trapezoid in the digit line direction and illustrate a tapered profile. The area of top surface 310 and the area of bottom surface 315 may also be unequal.

Self-selecting memory component 220-*a* includes top surface 310 in contact with top electrode 205-*a*. In some case, the area of contact between top electrode 205-*a* and top surface 310 of self-selecting memory component 220-*a* may be an electrode interface. In some cases, an asymmetrical electrode interface may be present between self-selecting memory component 220-*a* and top electrode 205-*a* and bottom electrode 210-*a*. Top electrode 205-*a* may include length 335 in the word line direction and length 355 in the digit line direction. Length 335 and length 355 may determine the dimensions and area of the top surface and bottom surface of top electrode 205-*a*. In some cases, length 335 may be equal when measured along the top surface and bottom surface of top electrode 205-*a* in the word line direction. That is, the cross-section of top electrode 205-*a* may be a rectangle in the word line direction and illustrate a straight profile. In some cases, length 355 may be equal when measured along the top surface and bottom surface of top electrode 205-*a* in the digit line direction. That is, the cross-section of top electrode 205-*a* may be a rectangle in the digit line direction and illustrate a straight profile. The area of the top surface and the area of bottom surface of top electrode 205-*a* may also be equal.

In some cases, length 335 may be unequal when measured along the top surface and bottom surface of top electrode 205-*a* in the word line direction. That is, the cross-section of top electrode 205-*a* may be a trapezoid or an inverted trapezoid and illustrate a curved or slanted geometric profile (e.g., a tapered profile or a stepped profile. In some cases, length 355 may be unequal when measured along the top surface and bottom surface of top electrode 205-*a* in the digit line direction. That is, the cross-section of top electrode 205-*a* may be a trapezoid or an inverted trapezoid rectangle in the digit line direction and illustrate a tapered profile. The area of the top surface and the area of bottom surface of top electrode 205-*a* may also be unequal.

In some cases, length 335 of top electrode 205-*a* may be less than length 340 of self-selecting memory component 220-*a* in the word line direction. In other examples, length 355 of top electrode 205-*a* may be less than length 360 of self-selecting memory component 220-*a* in the digit line direction. That is, top electrode 205-*a* may be smaller than self-selecting memory component 220-*a*. Such a configuration of the top electrode 205-*a* affects the size of the interface between the top electrode 205-*a* and the self-selecting memory component 220-*a*. The area of the interface may be less than the area of the top surface 310 of the self-selecting memory component 220-*a*.

From the perspective of the word line, a dielectric liner 305 may be in contact with one or more surfaces of top electrode 205-*a* and self-selecting memory component 220-*a*. For example, dielectric liner 305 may be in contact with side surface 320 and side surface 325 of top electrode 205-*a*. Dielectric liner 305 may also be in contact with top surface 310 of self-selecting memory component 220-*a*. For example, the dielectric liner 305 may be contact with portions of the top surface 310 that are not in contact with the top electrode 205-*a*. In some examples, dielectric liner 305 may be in contact with side surface 320, side surface 325, top surface 310, or a combination thereof. Dielectric liner 305 may be a dielectric material compatible with the material of the self-selecting memory component 220-*a*. For example, dielectric liner 305 may be an electrically neutral material.

Dielectric liner 305 may be disposed along one or more surfaces of memory device 302 to create space between the dimension of top electrode 205-*a* and the dimension of self-selecting memory component 220-*a*. For example, length 330 may greater than length 335 of top electrode 205-*a* and include dielectric liner 305 in contact with side surface 320 and side surface 325. In some cases, length 330 may be greater than length 335 of top electrode 205-*a*. In some examples, length 330 may be equal to length 340 of self-selecting memory component 220-*a* from the perspective of the word line.

In some examples, length 330 may vary depending on the length of dielectric liner 305 in contact with top surface 310 of self-selecting memory component 220-*a*. For example, an amount of dielectric liner 305 in contact with side surface 320 of top electrode 205-*a* and top surface 310 of self-selecting memory component 220-*a* may be different than an amount of dielectric liner 305 in contact with side surface 325 of top electrode 205-*a* and top surface 310 of self-selecting memory component 220-*a*. That is, the amount of dielectric liner 305 in contact with side surface 320 of top electrode 205-*a* and top surface 310 of self-selecting memory component 220-*a* may be greater than the amount of dielectric liner 305 in contact with side surface 325 of top electrode 205-*a* and top surface 310 of self-selecting memory component 220-*a*. Alternatively, the amount of dielectric liner 305 in contact with side surface 320 of top electrode 205-*a* and top surface 310 of self-selecting memory component 220-*a* may be less than the amount of dielectric liner 305 in contact with side surface 325 of top electrode 205-*a* and top surface 310 of self-selecting memory component 220-*a*.

From the perspective of the digit line, dielectric liner 305 may be in contact with side surface 380 and side surface 385 of top electrode 205-*a*. Additionally, dielectric liner 305 may be in contact with side surface 370 and side surface 375 of digit line 115-*b* in the digit line direction. Dielectric liner 305 may also be in contact with top surface 310 of self-selecting memory component 220-*a*. Dielectric liner 305 may also be in contact with side surface 370, side surface 380, side surface 375, side surface 385, top surface 310, or a combination thereof. Length 350 may include length 355 of top electrode 205-*a* and dielectric liner 305 in contact with side surface 380 and side surface 385. In some cases, length 350 may be greater than length 355 of top electrode 205-*a*. In some examples, length 350 may be equal to length 360 of self-selecting memory component 220-*a* from the perspective of the digit line.

Length 350 may vary depending on the length of dielectric liner 305 in contact with top surface 310 of self-selecting memory component 220-*a*. For example, an amount of dielectric liner 305 in contact with side surface 380 of top electrode 205-*a*, side surface 370 of digit line 115-*b*, and top surface 310 of self-selecting memory component 220-*a* may be different than an amount of dielectric liner 305 in contact with side surface 385 of top electrode 205-*a*, side surface 375 of digit line 115-*b*, and top surface 310 of self-selecting memory component 220-*a*. That is, the amount of dielectric liner 305 in contact with side surface 380 of top electrode 205-*a*, side surface 370 of digit line 115-*b*, and top surface 310 of self-selecting memory component 220-*a* may be greater than the amount of dielectric liner 305 in contact with side surface 385 of top electrode 205-*a*, side surface 375 of digit line 115-*b*, and top surface 310 of self-selecting memory component 220-*a*. Alternatively, the amount of dielectric liner 305 in contact with side surface 380 of top electrode 205-*a*, side surface 370 of digit line 115-*b*, and top surface 310 of self-selecting memory component 220-*a* may be less than the amount of dielectric liner 305 in contact with side surface 385 of top electrode 205-*a*, side surface 375 of digit line 115-*b*, and top surface 310 of self-selecting memory component 220-*a*.

Self-selecting memory component 220-*a* also includes bottom surface 315 in contact with bottom electrode 210-*a*. In some case, the area of contact between bottom electrode 210-*a* and bottom surface 315 of self-selecting memory component 220-*a* may be an electrode interface. In some cases, an asymmetrical electrode interface may be present between self-selecting memory component 220-*a* and top electrode 205-*a* and bottom electrode 210-*a*. Bottom electrode 210-*a* may include length 345 in the word line direction and length 365 in the digit line direction. Length 345 and length 365 may determine the dimensions and area of the top surface and bottom surface of top electrode 205-*a*. In some cases, length 345 may be equal when measured along the top surface and bottom surface of bottom electrode 210-*a* in the word line direction. That is, the cross-section of bottom electrode 210-*a* may be a rectangle in the word line direction and illustrate a straight profile. In some cases, length 365 may be equal when measured along the top surface and bottom surface of bottom electrode 210-*a* in the digit line direction. That is, the cross-section of bottom electrode 210-*a* may be a rectangle in the digit line direction and illustrate a straight profile.

In some cases, length 345 of bottom electrode 210-*a* may be equal to length 340 of self-selecting memory component 220-*a* in the word line direction. From the perspective of the digit line, length 365 of bottom electrode 210-*a* may be greater than length 360 of self-selecting memory component 220-*a*. Such a configuration of the bottom electrode 210-*a* affects the size of the interface between the bottom electrode 210-*a* and the self-selecting memory component 220-*a*. The area of the interface may be equal to the area of the bottom surface 315 of the self-selecting memory component 220-*a*.

In some cases, bottom electrode 210-*a* may illustrate a tapered profile in the word line direction, the digit line direction, or both. For example, bottom electrode 210-*a* may taper from a bottom surface in contact with word line 110-*b* to a top surface in contact with self-selecting memory component 220-*a*. The cross section of bottom electrode 210-*a* may be a trapezoid. Alternatively, bottom electrode 210-*a* may illustrate an inverted taper profile in the word line direction, the digit line direction, or both. That is, bottom electrode 210-*a* may taper from a top surface in contact with self-selecting memory component 220-*a* to a bottom surface in contact with word line 110-*b*. The cross section of bottom electrode 210-*a* may be an inverted trapezoid.

Bottom electrode 210-*a* may form different geometric shapes. For example, bottom electrode 210-*a* may be in the shape of a trapezoidal prism, and a cross-section of bottom electrode 210-*a* may include a trapezoid in the word line direction and a rectangle in the digit line direction. Alternatively, bottom electrode 210-*a* may be in the shape of an inverted trapezoidal prism, and a cross section of bottom electrode 210-*a* may include an inverted trapezoid in the word line direction and a rectangle in the digit line direction. In some cases, bottom electrode 210-*a* may be a frustum. A frustum, as used herein, includes a shape of or resembling the portion of a cone or pyramid with the upper portion removed, or a shape of or resembling the portion of a cone or pyramid between a first plane that intercepts the cone or pyramid below the top and a second plane at or above the base.

Top electrode 205-*a* may be in electronic communication with bottom electrode 210-*a* through self-selecting memory component 220-*a*. In some cases, length 335 of top electrode 205-*a* may be less than length 345 of bottom electrode 210-*a* in the word line direction. Alternatively, length 355 of top electrode 205-*a* may be less than length 365 of bottom electrode 210-*a* in the digit line direction. However, length 330 may be equal to length 345 of bottom electrode 210-*a* in the word line direction. In some cases, length 350 may be less than length 365 of bottom electrode 210-a in the digit line direction.

The area of contact (e.g., the interface) between top surface 310 of self-selecting memory component 220-a and top electrode 205-a may be determined by the dimensions of length 335 and length 355 of top electrode 205-a. The area of contact (e.g., the interface) between bottom surface 315 of self-selecting memory component 220-a and bottom electrode 210-a may be determined by the dimensions of length 345 and length 365 of bottom electrode 210-a. In some cases, the area of contact between top surface 310 of self-selecting memory component 220-a and top electrode 205-a and the area of contact between bottom surface 315 of self-selecting memory component 220-a and bottom electrode 210-a may be different to achieve asymmetrical electrode interfaces between top electrode 205-a and bottom electrode 210-a. For example, the area of contact between top surface 310 of self-selecting memory component 220-a and top electrode 205-a may be less than the area of contact between bottom surface 315 of self-selecting memory component 220-a and bottom electrode 210-a in the word line and digit line directions.

Self-selecting memory component 220-a may mimic a tapered profile 390 due to the asymmetrical electrode interfaces. From the perspective of the word line and digit line, self-selecting memory component 220-a may mimic a tapered profile 390 such that the area of contact between top surface 310 of self-selecting memory component 220-a and top electrode 205-a is less than the area of contact between bottom surface 315 of self-selecting memory component 220-a and bottom electrode 210-a. The tapered profile 390 may be from bottom surface 315 to top surface 310 of self-selecting memory component 220-a.

Memory cells may be read by applying a voltage across self-selecting memory component 220-a. The voltage may be applied across self-selecting memory component 220-a in a predetermined polarity (e.g., a positive polarity). The voltage may be applied to top surface 310 or bottom surface 315 of the self-selecting memory component 220-a. In some cases, the positive polarity voltage may be applied to the surface of self-selecting memory component 220-a with a greater area in contact with top electrode 205-a or bottom electrode 210-a. For example, the positive polarity voltage may be applied to bottom surface 315 in contact with bottom electrode 210-a.

The threshold voltage of self-selecting memory component 220-a and/or resulting current through self-selecting memory component 220-a may depend on the location of a high resistivity region and low resistivity region within self-selecting memory component 220-a due to the distribution of ions within self-selecting memory component 220-a that may be affected by ion migration. The resistivity of the region may be based on the composition of self-selecting memory component 220-a. For example, self-selecting memory component 220-a may be a chalcogenide material.

Figure 4:
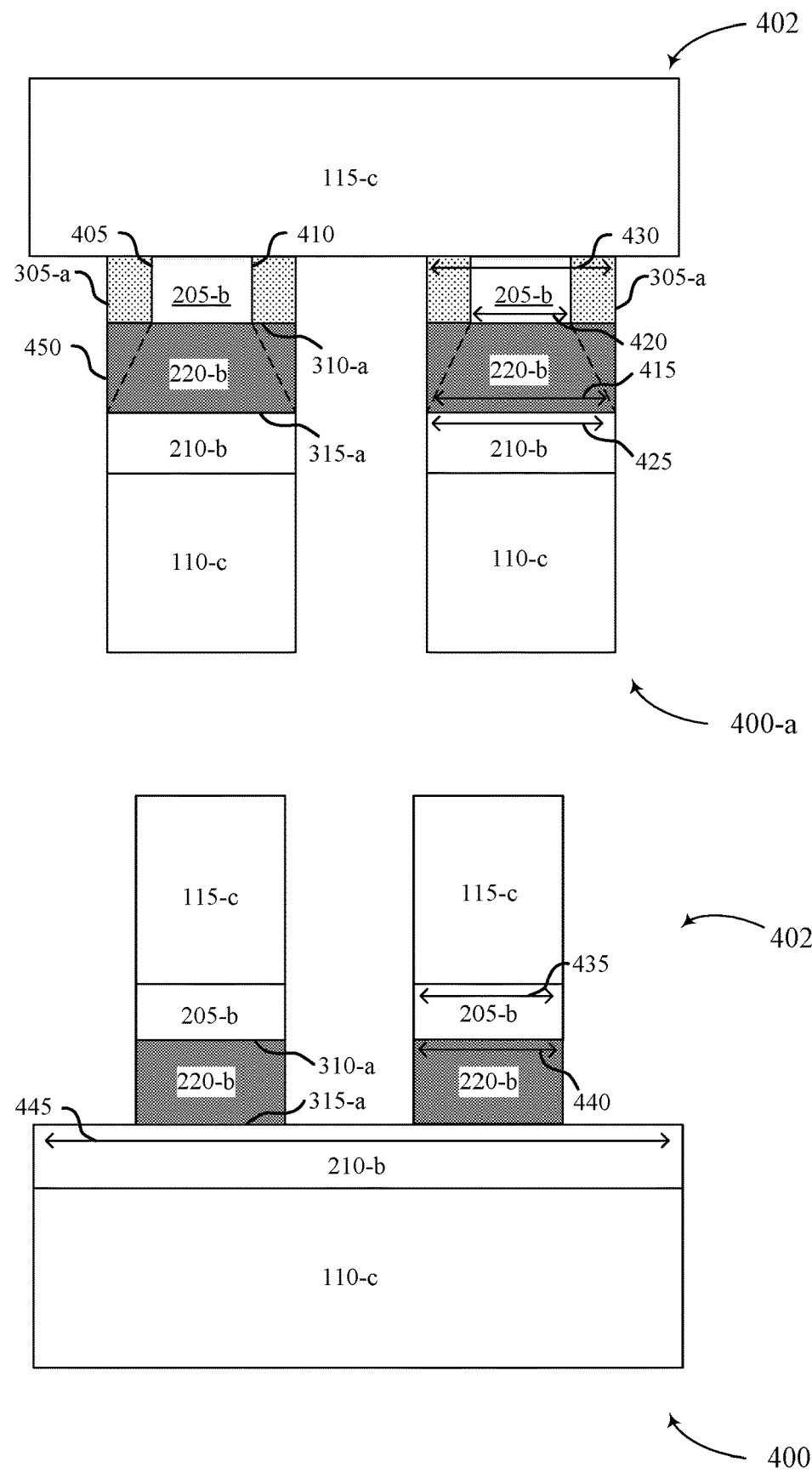
FIG. 4 illustrates example cross-sectional views of a memory device that supports memory cells with asymmetrical electrode interfaces in accordance with examples of the present disclosure.

FIG. 4 illustrates cross-sectional views 400-a and 400-b of a memory device 402 that support memory cells with asymmetrical electrode interfaces in accordance with examples of the present disclosure. Self-selecting memory component 220-b may have asymmetric electrode interfaces with top electrode 205-b and bottom electrode 210-b in a word line direction (e.g., first direction). For example, a length of the top electrode 205-b may be less than a length of the bottom electrode 210-b, thereby causing the top electrode interface with the self-selecting memory component 220-b to be smaller than the bottom electrode interface with the self-selected memory component 220-b. Top electrode 205-b may be coupled to digit line 115-c and bottom electrode 210-b may be coupled to word line 110-c.

Self-selecting memory component 220-b includes top surface 310-a and bottom surface 315-a opposite the top surface 310-a. Self-selecting memory component 220-b may also include length 415 in the word line direction and length 440 in the digit line direction. Length 415 and length 440 may determine the dimensions and area of top surface 310-a and bottom surface 315-a. In some cases, length 415 may be equal when measured along top surface 310-a and bottom surface 315-a in the word line direction. That is, the cross-section of self-selecting memory component 220-b may be a rectangle in the word line direction and illustrate a straight profile. In some cases, length 440 may be equal when measured along top surface 310-a and bottom surface 315-a in the digit line direction. That is, the cross-section of self-selecting memory component 220-b may be a rectangle in the digit line direction and illustrate a straight profile. The area of top surface 310-a and the area of bottom surface 315-a may also be equal.

In some cases, length 415 may be unequal when measured along top surface 310-a and bottom surface 315-a in the word line direction. That is, the cross-section of self-selecting memory component 220-b may be a trapezoid or an inverted trapezoid in the word line direction and illustrate a tapered profile. In some cases, length 440 may be unequal when measured along top surface 310-a and bottom surface 315-a in the digit line direction. That is, the cross-section of self-selecting memory component 220-b may be a trapezoid or an inverted trapezoid in the digit line direction and illustrate a tapered profile. The area of top surface 310-a and the area of bottom surface 315-a may also be unequal.

Self-selecting memory component 220-b includes top surface 310-a in contact with top electrode 205-b. In some case, the area of contact between top electrode 205-b and top surface 310-a of self-selecting memory component 220-b may be an electrode interface. In some cases, an asymmetrical electrode interface may be present between self-selecting memory component 220-b and top electrode 205-b and bottom electrode 210-b. Top electrode 205-b may include length 420 in the word line direction and length 435 in the digit line direction. Length 425 and length 435 may determine the dimensions and area of the top surface and bottom surface of top electrode 205-b. In some cases, length 420 may be equal when measured along the top surface and bottom surface of top electrode 205-b in the word line direction. That is, the cross-section of top electrode 205-b may be a rectangle in the word line direction and illustrate a straight profile. In some cases, length 435 may be equal when measured along the top surface and bottom surface of top electrode 205-b in the digit line direction. That is, the cross-section of top electrode 205-b may be a rectangle in the digit line direction and illustrate a straight profile. The area of the top surface and the area of bottom surface of top electrode 205-b may also be equal.

In some cases, length 420 may be unequal when measured along the top surface and bottom surface of top electrode 205-b in the word line direction. That is, the cross-section of top electrode 205-b may be a trapezoid or an inverted trapezoid and illustrate a curved or slanted geometric profile (e.g., a tapered profile or a stepped profile. In some cases, length 435 may be unequal when measured along the top surface and bottom surface of top electrode 205-b in the digit line direction. That is, the cross-section of top electrode 205-b may be a trapezoid or an inverted trapezoid rectangle in the digit line direction and illustrate a tapered profile. The area of the top surface and the area of bottom surface of top electrode 205-*b* may also be unequal.

In some cases, length 420 of top electrode 205-*b* may be less than length 415 of self-selecting memory component 220-*b* in the word line direction. In other examples, length 435 of top electrode 205-*b* may be equal to length 440 of self-selecting memory component 220-*b* in the digit line direction. Such a configuration of the top electrode 205-*b* affects the size of the interface between the top electrode 205-*b* and the self-selecting memory component 220-*b*. The area of the interface may be less than the area of the top surface 310-*a* of the self-selecting memory component 220-*b*.

From the perspective of the word line, a dielectric liner 305-*a* may be in contact with one or more surfaces of top electrode 205-*b* and self-selecting memory component 220-*b*. For example, dielectric liner 305-*a* may be in contact with side surface 405 and side surface 410 of top electrode 205-*b*. Dielectric liner 305-*a* may also be in contact with top surface 310-*a* of self-selecting memory component 220-*b*. In some examples, dielectric liner 305-*a* may be in contact with side surface 405, side surface 410, top surface 310-*a*, or a combination thereof. Dielectric liner 305-*a* may be a dielectric material compatible with the material of the self-selecting memory component 220-*b*. For example, dielectric liner 305-*a* may be an electrically neutral material.

Dielectric liner 305-*a* may be disposed along one or more surfaces of memory device 402 to create space between the dimension of top electrode 205-*b* and the dimension of self-selecting memory component 220-*b*. For example, length 430 may include length 420 of top electrode 205-*b* and dielectric liner 305-*a* in contact with side surface 405 and side surface 410. In some cases, length 430 may be greater than length 420 of top electrode 205-*b*. In some examples, length 430 may be equal to length 415 of self-selecting memory component 220-*b* from the perspective of the word line.

In some examples, length 430 may vary depending on the length of dielectric liner 305-*a* in contact with top surface 310-*a* of self-selecting memory component 220-*b*. For example, an amount of dielectric liner 305-*a* in contact with side surface 405 of top electrode 205-*b* and top surface 310-*a* of self-selecting memory component 220-*b* may be different than an amount of dielectric liner 305-*a* in contact with side surface 410 of top electrode 205-*b* and top surface 310-*a* of self-selecting memory component 220-*b*. That is, the amount of dielectric liner 305-*a* in contact with side surface 405 of top electrode 205-*b* and top surface 310-*a* of self-selecting memory component 220-*b* may be greater than the amount of dielectric liner 305-*a* in contact with side surface 410 of top electrode 205-*b* and top surface 310-*a* of self-selecting memory component 220-*b*. Alternatively, the amount of dielectric liner 305-*a* in contact with side surface 405 of top electrode 205-*b* and top surface 310-*a* of self-selecting memory component 220-*b* may be less than the amount of dielectric liner 305-*a* in contact with side surface 410 of top electrode 205-*b* and top surface 310-*a* of self-selecting memory component 220-*b*. From the perspective of the digit line, dielectric liner 305-*a* may be absent from memory device 402.

Self-selecting memory component 220-*b* also includes bottom surface 315-*a* in contact with bottom electrode 210-*b*. In some case, the area of contact between bottom electrode 210-*b* and bottom surface 315-*a* of self-selecting memory component 220-*b* may be an electrode interface. In some cases, an asymmetrical electrode interface may be present between self-selecting memory component 220-*b* and top electrode 205-*b* and bottom electrode 210-*b*. Bottom electrode 210-*b* may include length 425 in the word line direction and length 445 in the digit line direction. Length 425 and length 445 may determine the dimensions and area of the top surface and bottom surface of top electrode 205-*b*. In some cases, length 425 may be equal when measured along the top surface and bottom surface of bottom electrode 210-*b* in the word line direction. That is, the cross-section of bottom electrode 210-*b* may be a rectangle in the word line direction and illustrate a straight profile. In some cases, length 445 may be equal when measured along the top surface and bottom surface of bottom electrode 210-*b* in the digit line direction. That is, the cross-section of bottom electrode 210-*b* may be a rectangle in the digit line direction and illustrate a straight profile.

In some cases, length 425 of bottom electrode 210-*b* may be equal to length 415 of self-selecting memory component 220-*b* in the word line direction. From the perspective of the digit line, length 445 of bottom electrode 210-*b* may be greater than length 440 of self-selecting memory component 220-*b*. Such a configuration of the bottom electrode 210-*b* affects the size of the interface between the bottom electrode 210-*b* and the self-selecting memory component 220-*b*. The area of the interface may be equal to the area of the bottom surface 315-*a* of the self-selecting memory component 220-*b*.

In some cases, bottom electrode 210-*b* may illustrate a tapered profile in the word line direction, the digit line direction, or both. For example, bottom electrode 210-*b* may taper from a bottom surface in contact with word line 110-*c* to a top surface in contact with self-selecting memory component 220-*b*. The cross section of bottom electrode 210-*b* may be a trapezoid. Alternatively, bottom electrode 210-*b* may illustrate an inverted taper profile in the word line direction, the digit line direction, or both. That is, bottom electrode 210-*b* may taper from a top surface in contact with self-selecting memory component 220-*b* to a bottom surface in contact with word line 110-*c*. The cross section of bottom electrode 210-*b* may be an inverted trapezoid.

Bottom electrode 210-*b* may form different geometric shapes. For example, bottom electrode 210-*b* may be in the shape of a trapezoidal prism, and a cross-section of bottom electrode 210-*b* may include a trapezoid in the word line direction and a rectangle in the digit line direction. Alternatively, bottom electrode 210-*b* may be in the shape of an inverted trapezoidal prism, and a cross section of bottom electrode 210-*b* may include an inverted trapezoid in the word line direction and a rectangle in the digit line direction. In some cases, bottom electrode 210-*b* may be a frustum. A frustum, as used herein, includes a shape of or resembling the portion of a cone or pyramid with the upper portion removed, or a shape of or resembling the portion of a cone or pyramid between a first plane that intercepts the cone or pyramid below the top and a second plane at or above the base.

Top electrode 205-*b* may be in electronic communication with bottom electrode 210-*b* through self-selecting memory component 220-*b*. In some cases, length 420 of top electrode 205-*b* may be less than length 425 of bottom electrode 210-*b* in the word line direction. Alternatively, length 435 of top electrode 205-*b* may be less than length 445 of bottom electrode 210-*b* in the digit line direction. However, length 430 may be equal to length 425 of bottom electrode 210-*b* in the word line direction.

The area of contact (e.g., the interface) between top surface 310-*a* of self-selecting memory component 220-*b* and top electrode 205-*b* may be determined by the dimensions of length 420 and length 435 of top electrode 205-*b*. The area of contact (e.g., the interface) between bottom surface 315-*a* of self-selecting memory component 220-*a* and bottom electrode 210-*b* may be determined by the dimensions of length 425 and length 445 of bottom electrode 210-*b*. In some cases, the area of contact between top surface 310-*a* of self-selecting memory component 220-*b* and top electrode 205-*b* and the area of contact between bottom surface 315-*a* of self-selecting memory component 220-*b* and bottom electrode 210-*b* may be different to achieve asymmetrical electrode interfaces between top electrode 205-*b* and bottom electrode 210-*b*. For example, the area of contact between top surface 310-*a* of self-selecting memory component 220-*b* and top electrode 205-*b* may be less than the area of contact between bottom surface 315-*a* of self-selecting memory component 220-*b* and bottom electrode 210-*b* in the word line direction.

Self-selecting memory component 220-*b* may mimic a tapered profile 450 due to the asymmetrical electrode interfaces. From the perspective of the word line, self-selecting memory component 220-*b* may mimic a tapered profile 450 such that the area of contact between top surface 310-*a* of self-selecting memory component 220-*b* and top electrode 205-*b* is less than the area of contact between bottom surface 315-*a* of self-selecting memory component 220-*b* and bottom electrode 210-*b*. The tapered profile 450 may be from bottom surface 315-*a* to top surface 310-*a* of self-selecting memory component 220-*b*.

Memory cells may be read by applying a voltage across self-selecting memory component 220-*b*. The voltage may be applied across self-selecting memory component 220-*b* in a predetermined polarity (e.g., a positive polarity). The voltage may be applied to top surface 310-*a* or bottom surface 315-*a* of the self-selecting memory component 220-*b*. In some cases, the positive polarity voltage may be applied to the surface of self-selecting memory component 220-*b* with a greater area in contact with top electrode 205-*b* or bottom electrode 210-*b*. For example, the positive polarity voltage may be applied to bottom surface 315-*a* in contact with bottom electrode 210-*b*.

The threshold voltage of self-selecting memory component 220-*b* and/or resulting current through self-selecting memory component 220-*b* may depend on the location of a high resistivity region and low resistivity region within self-selecting memory component 220-*b* due to the distribution of ions within self-selecting memory component 220-*b* that may be affected by ion migration. The resistivity of the region may be based on the composition of self-selecting memory component 220-*b*. For example, self-selecting memory component 220-*b* may be a chalcogenide material.

Figure 5:
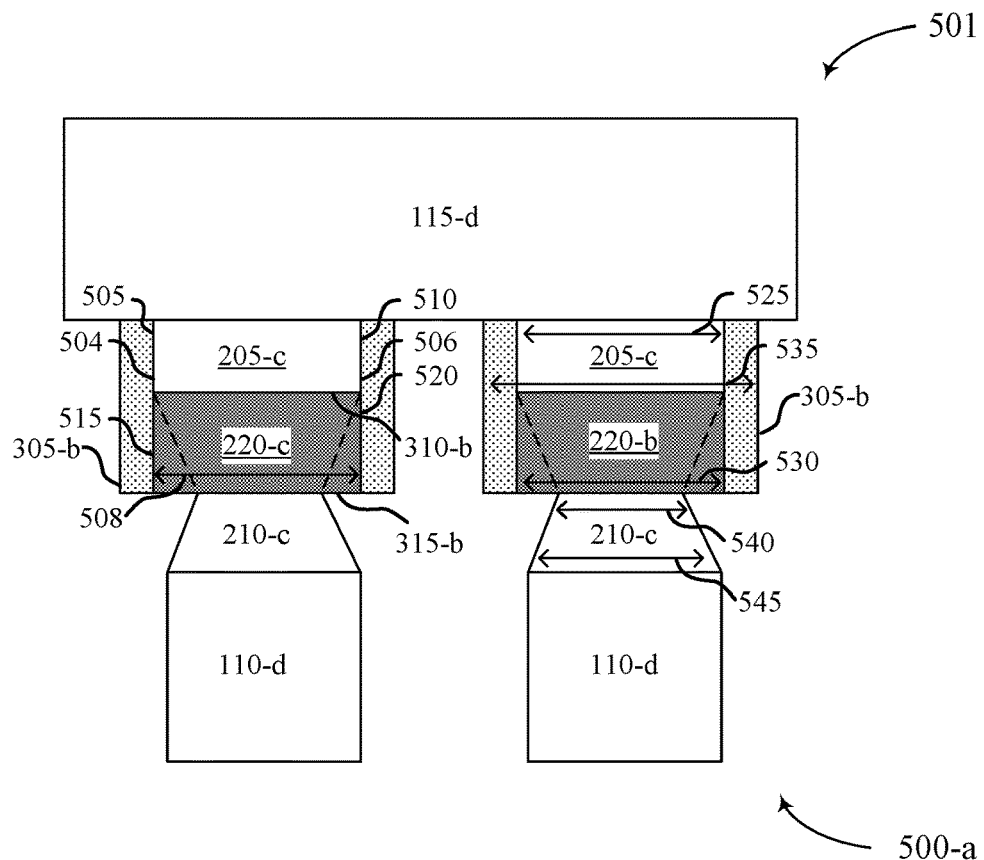
FIG. 5 illustrates example cross-sectional views of a memory device that supports memory cells with asymmetrical electrode interfaces in accordance with examples of the present disclosure.
Figure 5:
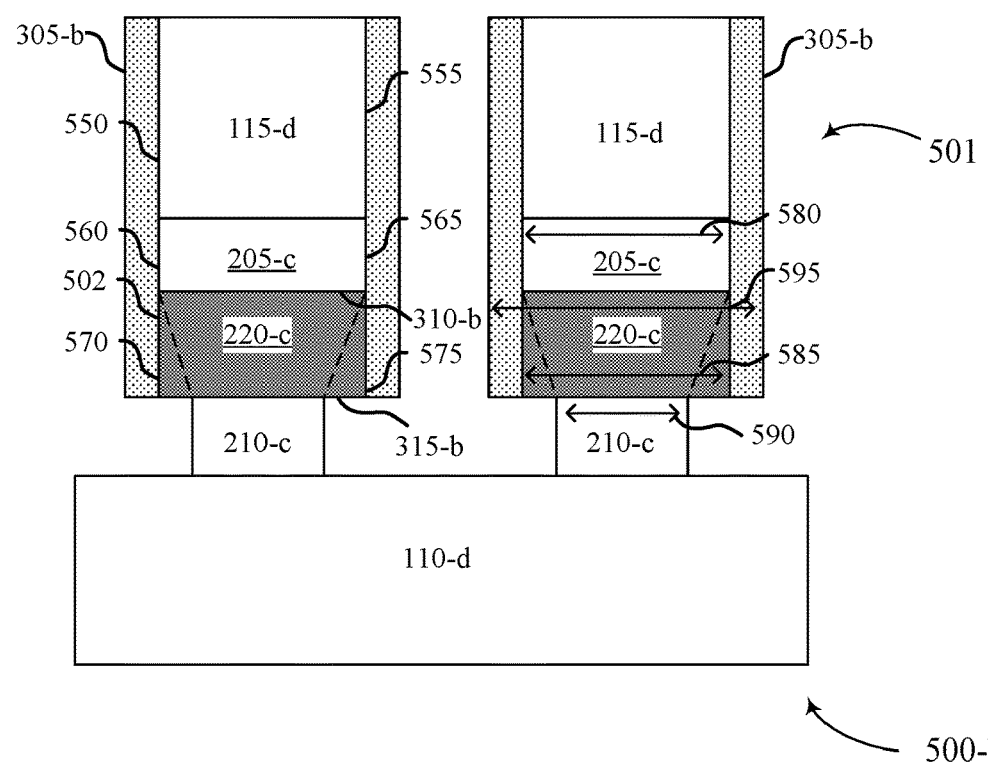

FIG. 5 illustrates cross-sectional views 500-*a* and 500-*b* of a memory device 501 that support memory cells with asymmetrical electrode interfaces in accordance with examples of the present disclosure. Self-selecting memory component 220-*c* may have asymmetric electrode interfaces with the top electrode 205-*c* and bottom electrode 210-*c* in a word line direction (e.g., first direction) and digit line direction (e.g., second direction). For example, a length of the bottom electrode 210-*c* may be less than a length of the top electrode 205-*c*, thereby causing the bottom electrode interface with the self-selecting memory component 220-*c* to be smaller than the bottom electrode interface with the self-selected memory component 220-*c*. Top electrode 205-*c* may be coupled to digit line 115-*d* and bottom electrode 210-*c* may be coupled to word line 110-*d*.

Self-selecting memory component 220-*c* includes top surface 310-*b* and bottom surface 315-*b* is opposite the top surface 310-*b*. Self-selecting memory component 220-*c* may also include length 530 in the word line direction and length 585 in the digit line direction. Length 530 and length 585 may determine the dimensions and area of top surface 310-*b* and bottom surface 315-*b*. In some cases, length 530 may be equal when measured along top surface 310-*b* and bottom surface 315-*b* in the word line direction. That is, the cross-section of self-selecting memory component 220-*c* may be a rectangle in the word line direction and illustrate a straight profile. In some cases, length 585 may be equal when measured along top surface 310-*b* and bottom surface 315-*b* in the digit line direction. That is, the cross-section of self-selecting memory component 220-*c* may be a rectangle in the digit line direction and illustrate a straight profile. The area of top surface 310-*b* and the area of bottom surface 315-*b* may also be equal.

In some cases, length 530 may be unequal when measured along top surface 310-*b* and bottom surface 315-*b* in the word line direction. That is, the cross-section of self-selecting memory component 220-*c* may be a trapezoid or an inverted trapezoid and illustrate a curved or slanted geometric profile (e.g., a tapered profile or a stepped profile. In some cases, length 585 may be unequal when measured along top surface 310-*b* and bottom surface 315-*b* in the digit line direction. That is, the cross-section of self-selecting memory component 220-*c* may be a trapezoid or an inverted trapezoid in the digit line direction and illustrate a tapered profile. The area of top surface 310-*b* and the area of bottom surface 315-*b* may also be unequal.

Self-selecting memory component 220-*c* includes top surface 310-*b* in contact with top electrode 205-*c*. In some case, the area of contact between top electrode 205-*c* and top surface 310-*b* of self-selecting memory component 220-*c* may be an electrode interface. In some cases, an asymmetrical electrode interface may be present between self-selecting memory component 220-*c* and top electrode 205-*c* and bottom electrode 210-*c*. Top electrode 205-*c* may include length 525 in the word line direction and length 580 in the digit line direction. Length 525 and length 580 may determine the dimensions and area of the top surface and bottom surface of top electrode 205-*c*. In some cases, length 525 may be equal when measured along the top surface and bottom surface of top electrode 205-*c* in the word line direction. That is, the cross-section of top electrode 205-*c* may be a rectangle in the word line direction and illustrate a straight profile. In some cases, length 580 may be equal when measured along the top surface and bottom surface of top electrode 205-*c* in the digit line direction. That is, the cross-section of top electrode 205-*c* may be a rectangle in the digit line direction and illustrate a straight profile. The area of the top surface and the area of bottom surface of top electrode 205-*c* may also be equal.

In some cases, length 525 may be unequal when measured along the top surface and bottom surface of top electrode 205-*c* in the word line direction. That is, the cross-section of top electrode 205-*c* may be a trapezoid or an inverted trapezoid and illustrate a curved or slanted geometric profile (e.g., a tapered profile or a stepped profile. In some cases, length 580 may be unequal when measured along the top surface and bottom surface of top electrode 205-*c* in the digit line direction. That is, the cross-section of top electrode 205-*c* may be a trapezoid or an inverted trapezoid rectangle in the digit line direction and illustrate a tapered profile. The area of the top surface and the area of bottom surface of top electrode 205-*c* may also be unequal.

In some cases, length 525 of top electrode 205-*c* may be equal to length 530 of self-selecting memory component 220-*c* in the word line direction. In other examples, length 580 of top electrode 205-*c* may be equal to length 585 of self-selecting memory component 220-*c* in the digit line direction. That is, top electrode 205-*c* may be the same size as self-selecting memory component 220-*c*. Such a configuration of the top electrode 205-*c* affects the size of the interface between the top electrode 205-*c* and the self-selecting memory component 220-*c*. The area of the interface may be equal to the area of the top surface 310-*b* of the self-selecting memory component 220-*c*.

From the perspective of the word line, a dielectric liner 305-*b* may be in contact with one or more surfaces of top electrode 205-*c* and self-selecting memory component 220-*c*. For example, dielectric liner 305-*b* may be in contact with side surface 505 and side surface 510 of top electrode 205-*c*. Dielectric liner 305-*b* may also be in contact with side surface 515 and side surface 520 of self-selecting memory component 220-*c*. In some examples, dielectric liner 305-*b* may be in contact with side surface 505, side surface 510, side surface 515, side surface 520, or a combination thereof. Dielectric liner 305-*b* may be a dielectric material compatible with the material of the self-selecting memory component 220-*c*. For example, dielectric liner 305-*b* may be an electrically neutral material.

Dielectric liner 305-*b* may be disposed along one or more surfaces of memory device 501- to create space between the dimension of bottom electrode 210-*c* and the dimension of self-selecting memory component 220-*c*. For example, length 535 may include length 525 of top electrode 205-*c* and dielectric liner 305-*b* in contact with side surface 505 and side surface 510. In some cases, length 535 may be greater than length 525 of top electrode 205-*c*. In some examples, length 535 may be greater than length 530 of self-selecting memory component 220-*c* from the perspective of the word line.

Further, length 508 may be measured between inner surface 504 and 506 of dielectric liner 305-*b* in the word line direction. Inner surfaces 504 and 506 of dielectric liner 305-*b* may be in contact with side surfaces 505 and 510 of top electrode 205-*c*. In addition, inner surfaces 504 and 506 of dielectric liner 305-*b* may also be in contact with side surfaces 515 and 520 of self-selecting memory component 220-*c*. In some cases, length 508 may be greater than length 540 and 545 of bottom electrode 210-*c*.

In some examples, length 535 may vary depending on the length of dielectric liner 305-*b* in contact with side surface 505 and side surface 510 of top electrode 205-*c* and side surface 505 and side surface 510 of self-selecting memory component 220-*c*. For example, an amount of dielectric liner 305-*b* in contact with side surface 505 of top electrode 205-*c* and side surface 515 of self-selecting memory component 220-*c* may be different than an amount of dielectric liner 305-*b* in contact with side surface 510 of top electrode 205-*c* and side surface 520 of self-selecting memory component 220-*c*. That is, the amount of dielectric liner 305-*b* in contact with side surface 505 of top electrode 205-*c* and side surface 515 of self-selecting memory component 220-*c* may be greater than the amount of dielectric liner 305-*b* in contact with side surface 510 of top electrode 205-*c* and side surface 520 of self-selecting memory component 220-*c*. Alternatively, the amount of dielectric liner 305-*b* in contact with side surface 505 of top electrode 205-*c* and side surface 515 of self-selecting memory component 220-*c* may be less than the amount of dielectric liner 305-*b* in contact with side surface 510 of top electrode 205-*c* and side surface 520 of self-selecting memory component 220-*c*.

From the perspective of the digit line, dielectric liner 305-*b* may be in contact with side surface 560 and side surface 565 of top electrode 205-*c*. Additionally, dielectric liner 305-*b* may be in contact with side surface 550 and side surface 555 of digit line 115-*d* in the digit line direction. Dielectric liner 305-*b* may also be in contact with side surface 570 and side surface 575 of self-selecting memory component 220-*c*. Dielectric liner 305-*b* may be in contact with side surfaces 550, 555, 560, 565, 570, and 575, or a combination thereof. Length 595 may include length 580 of top electrode 205-*c* and dielectric liner 305-*b* in contact with side surfaces 550, 555, 560, 565, 570, and 575. In some cases, length 595 may be greater than length 580 of top electrode 205-*c*. In some examples, length 595 may be greater than length 585 of self-selecting memory component 220-*c* from the perspective of the digit line.

Length 595 may vary depending on the length of dielectric liner 305-*b* in contact with side surfaces 560 and 565 of top electrode 205-*c*, side surfaces 570 and 575 of self-selecting memory component 220-*c*, and side surfaces 550 and 555 of digit line 115-*d*. For example, an amount of dielectric liner 305-*b* in contact with side surface 560 of top electrode 205-*c*, side surface 550 of digit line 115-*d*, and side surface 570 of self-selecting memory component 220-*c* may be different than an amount of dielectric liner 305-*b* in contact with side surface 565 of top electrode 205-*c*, side surface 555 of digit line 115-*d*, and side surface 575 of self-selecting memory component 220-*c*. That is, the amount of dielectric liner 305-*b* in contact the side surface 560 of top electrode 205-*c*, side surface 550 of digit line 115-*d*, and side surface 570 of self-selecting memory component 220-*c* may be greater than the amount of dielectric liner 305-*b* in contact with side surface 565 of top electrode 205-*c*, side surface 555 of digit line 115-*d*, and side surface 575 of self-selecting memory component 220-*c*.

Alternatively, the amount of dielectric liner 305-*b* in contact with side surface 560 of top electrode 205-*c*, side surface 550 of digit line 115-*d*, and side surface 570 of self-selecting memory component 220-*c* may be less than the amount of dielectric liner 305-*b* in contact with side surface 565 of top electrode 205-*c*, side surface 555 of digit line 115-*d*, and side surface 575 of self-selecting memory component 220-*c*.

Self-selecting memory component 220-*c* also includes bottom surface 315-*b* in contact with bottom electrode 210-*c*. In some case, the area of contact between bottom electrode 210-*c* and bottom surface 315-*b* of self-selecting memory component 220-*c* may be an electrode interface. In some cases, an asymmetrical electrode interface may be present between self-selecting memory component 220-*c* and top electrode 205-*c* and bottom electrode 210-*c*. Bottom electrode 210-*c* may include bottom length 545 and top length 540 in the word line direction and length 590 in the digit line direction. In some cases, bottom length 545 may be greater than top length 540. That is, the cross-section of bottom electrode 210-*c* may be a trapezoid in the word line direction and illustrate a tapered profile. In some cases, length 590 may be equal when measured along the top surface and bottom surface of bottom electrode 210-*c* in the digit line direction. That is, the cross-section of bottom electrode 210-*c* may be a rectangle in the digit line direction and illustrate a straight profile.

In some cases, top length 540 and bottom length 545 of bottom electrode 210-*c* may be less than length 530 of self-selecting memory component 220-*c* in the word line direction. From the perspective of the digit line, length 590 of bottom electrode 210-c may be less than length 585 of self-selecting memory component 220-c. Such a configuration of the bottom electrode 210-c affects the size of the interface between the bottom electrode 210-c and the self-selecting memory component 220-c. The area of the interface may be less than the area of the bottom surface 315-b of the self-selecting memory component 220-c.

In some cases, bottom electrode 210-c may illustrate a tapered profile in the word line direction, the digit line direction or both. For example, bottom electrode 210-c may taper from a bottom surface in contact with word line 110-d to a top surface in contact with self-selecting memory component 220-c. The cross section of bottom electrode 210-c may be a trapezoid. Alternatively, bottom electrode 210-c may illustrate an inverted taper profile in the word line direction, the digit line direction, or both. That is, bottom electrode 210-c may taper from a top surface in contact with self-selecting memory component 220-c to a bottom surface in contact with word line 110-d. The cross section of bottom electrode 210-c may be an inverted trapezoid.

Bottom electrode 210-c may form different geometric shapes. For example, bottom electrode 210-c may be in the shape of a trapezoidal prism, and a cross-section of bottom electrode 210-c may include a trapezoid in the word line direction and a rectangle in the digit line direction. Alternatively, bottom electrode 210-c may be in the shape of an inverted trapezoidal prism, and a cross section of bottom electrode 210-c may include an inverted trapezoid in the word line direction and a rectangle in the digit line direction. In some cases, bottom electrode 210-c may be a frustum.

Top electrode 205-c may be in electronic communication with bottom electrode 210-c through self-selecting memory component 220-c. In some cases, length 525 of top electrode 205-c may be greater than top length 540 and bottom length 545 of bottom electrode 210-c in the word line direction. Alternatively, length 580 of top electrode 205-c may be greater than length 590 of bottom electrode 210-c in the digit line direction. Length 535 may be greater than top length 540 and bottom length 545 of bottom electrode 210-c in the word line direction. In some cases, length 595 may be greater than length 590 of bottom electrode 210-c in the digit line direction.

The area of contact (e.g., the interface) between top surface 310-b of self-selecting memory component 220-c and top electrode 205-c may be determined by the dimensions of length 525 and length 580 of top electrode 205-c. The area of contact (e.g., the interface) between bottom surface 315-b of self-selecting memory component 220-c and bottom electrode 210-c may be determined by the dimensions of top length 540 and length 590 of bottom electrode 210-c. In some cases, the area of contact between top surface 310-b of self-selecting memory component 220-c and top electrode 205-c and the area of contact between bottom surface 315-b of self-selecting memory component 220-c and bottom electrode 210-c may be different to achieve asymmetrical electrode interfaces between top electrode 205-c and bottom electrode 210-c. For example, the area of contact between top surface 310-b of self-selecting memory component 220-c and top electrode 205-c may be greater than the area of contact between bottom surface 315-b of self-selecting memory component 220-c and bottom electrode 210-c in the word line and digit line directions.

Self-selecting memory component 220-c may mimic a tapered profile 502 due to the asymmetrical electrode interfaces. From the perspective of the word line and digit line, self-selecting memory component 220-c may mimic a tapered profile 502 such that the area of contact between top surface 310-b of self-selecting memory component 220-c and top electrode 205-c is greater than the area of contact between bottom surface 315-b of self-selecting memory component 220-c and bottom electrode 210-c. The tapered profile 502 may be from top surface 310-b to bottom surface 315-b of self-selecting memory component 220-c.

Memory cells may be read by applying a voltage across self-selecting memory component 220-c. The voltage may be applied across self-selecting memory component 220-c in a predetermined polarity (e.g., a positive polarity). The voltage may be applied to top surface 310-b or bottom surface 315-b of the self-selecting memory component 220-c. In some cases, the positive polarity voltage may be applied to the surface of self-selecting memory component 220-c with a greater area in contact with top electrode 205-c or bottom electrode 210-c. For example, the positive polarity voltage may be applied to top surface 310-b in contact with top electrode 205-c.

The threshold voltage of self-selecting memory component 220-c and/or resulting current through self-selecting memory component 220-c may depend on the location of a high resistivity region and low resistivity region within self-selecting memory component 220-c due to the distribution of ions within self-selecting memory component 220-c that may be affected by ion migration. The resistivity of the region may be based on the composition of self-selecting memory component 220-c. For example, self-selecting memory component 220-c may be a chalcogenide material.

Figure 6:
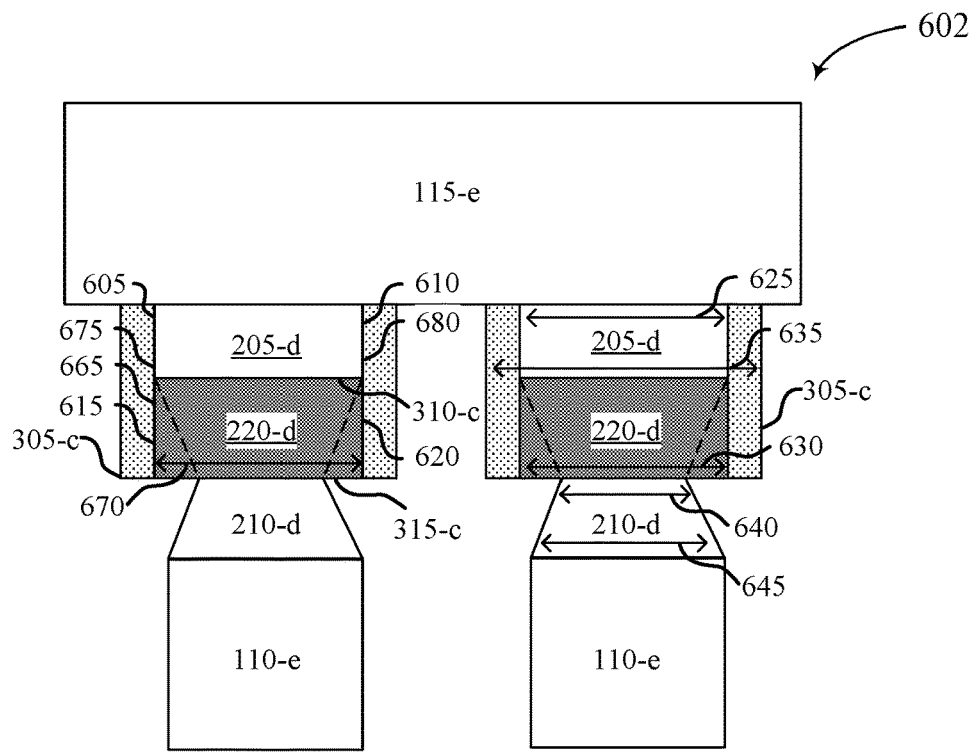
FIG. 6 illustrates example cross-sectional views of a memory device that supports memory cells with asymmetrical electrode interfaces in accordance with examples of the present disclosure.
Figure 6:
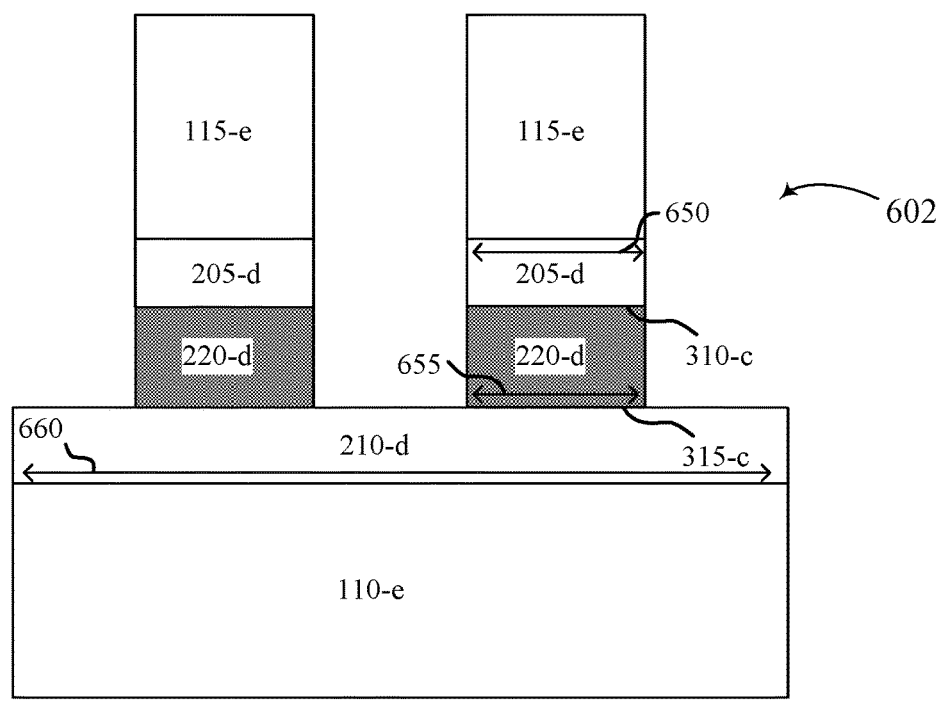

FIG. 6 illustrates cross-sectional views 600-a and 600-b of a memory device 602 that support memory cells with asymmetrical electrode interfaces in accordance with examples of the present disclosure. Self-selecting memory component 220-d may have asymmetric electrode interfaces with top electrode 205-d and bottom electrode 210-d in a word line direction (e.g., first direction). For example, a length of the bottom electrode 210-d may be less than a length of the top electrode 205-d, thereby causing the bottom electrode interface with the self-selecting memory component 220-d to be smaller than the bottom electrode interface with the self-selected memory component 220-d. Top electrode 205-d may be coupled to digit line 115-e and bottom electrode 210-d may be coupled to word line 110-e.

Self-selecting memory component 220-d includes top surface 310-c and bottom surface 315-c opposite the top surface 310-c. Self-selecting memory component 220-d may also include length 630 in the word line direction and length 655 in the digit line direction. Length 630 and length 655 may determine the dimensions and area of top surface 310-c and bottom surface 315-c. In some cases, length 630 may be equal when measured along top surface 310-c and bottom surface 315-c in the word line direction. That is, the cross-section of self-selecting memory component 220-d may be a rectangle in the word line direction and illustrate a straight profile. In some cases, length 655 may be equal when measured along top surface 310-c and bottom surface 315-c in the digit line direction. That is, the cross-section of self-selecting memory component 220-d may be a rectangle in the digit line direction and illustrate a straight profile. The area of top surface 310-c and the area of bottom surface 315-c may also be equal.

In some cases, length 630 may be unequal when measured along top surface 310-c and bottom surface 315-c in the word line direction. That is, the cross-section of self-selecting memory component 220-d may be a trapezoid or an inverted trapezoid and illustrate a curved or slanted geometric profile (e.g., a tapered profile or a stepped profile. In some cases, length 655 may be unequal when measured along top surface 310-c and bottom surface 315-c in the digit line direction. That is, the cross-section of self-selecting memory component 220-d may be a trapezoid or an inverted trapezoid in the digit line direction and illustrate a tapered profile. The area of top surface 310-c and the area of bottom surface 315-c may also be unequal.

Self-selecting memory component 220-d includes top surface 310-c in contact with top electrode 205-d. In some case, the area of contact between top electrode 205-d and top surface 310-c of self-selecting memory component 220-d may be an electrode interface. In some cases, an asymmetrical electrode interface may be present between self-selecting memory component 220-d and top electrode 205-d and bottom electrode 210-d. Top electrode 205-d may include length 625 in the word line direction and length 650 in the digit line direction. Length 625 and length 650 may determine the dimensions and area of the top surface and bottom surface of top electrode 205-d. In some cases, length 625 may be equal when measured along the top surface and bottom surface of top electrode 205-d in the word line direction. That is, the cross-section of top electrode 205-d may be a rectangle in the word line direction and illustrate a straight profile. In some cases, length 650 may be equal when measured along the top surface and bottom surface of top electrode 205-d in the digit line direction. That is, the cross-section of top electrode 205-d may be a rectangle in the digit line direction and illustrate a straight profile. The area of the top surface and the area of bottom surface of top electrode 205-d may also be equal.

In some cases, length 625 may be unequal when measured along the top surface and bottom surface of top electrode 205-d in the word line direction. That is, the cross-section of top electrode 205-d may be a trapezoid or an inverted trapezoid and illustrate a curved or slanted geometric profile (e.g., a tapered profile or a stepped profile. In some cases, length 650 may be unequal when measured along the top surface and bottom surface of top electrode 205-d in the digit line direction. That is, the cross-section of top electrode 205-d may be a trapezoid or an inverted trapezoid rectangle in the digit line direction and illustrate a tapered profile. The area of the top surface and the area of bottom surface of top electrode 205-d may also be unequal.

In some cases, length 625 of top electrode 205-d may be equal to length 630 of self-selecting memory component 220-d in the word line direction. In other examples, length 650 of top electrode 205-d may be equal to length 655 of self-selecting memory component 220-d in the digit line direction. That is, top electrode 205-d may be the same size as self-selecting memory component 220-d. Such a configuration of the top electrode 205-d affects the size of the interface between the top electrode 205-d and the self-selecting memory component 220-d. The area of the interface may be equal to the area of the top surface 310-c of the self-selecting memory component 220-d.

From the perspective of the word line, a dielectric liner 305-c may be in contact with one or more surfaces of top electrode 205-d and self-selecting memory component 220-d. For example, dielectric liner 305-c may be in contact with side surface 605 and side surface 610 of top electrode 205-d. Dielectric liner 305-b may also be in contact with side surface 615 and side surface 620 of self-selecting memory component 220-d. In some examples, dielectric liner 305-c may be in contact with side surface 605, side surface 610, side surface 615, side surface 620, or a combination thereof.

Dielectric liner 305-c may be a dielectric material compatible with the material of the self-selecting memory component 220-d. For example, dielectric liner 305-c may be an electrically neutral material.

Dielectric liner 305-c may be disposed along one or more surfaces of memory device 602 to create space between the dimension of bottom electrode 210-d and the dimension of self-selecting memory component 220-d. For example, length 635 may include length 625 of top electrode 205-d and dielectric liner 305-c in contact with side surface 605 and side surface 610. In some cases, length 635 may be greater than length 625 of top electrode 205-d. In some examples, length 635 may be greater than length 630 of self-selecting memory component 220-d from the perspective of the word line.

Further, length 670 may be measured between inner surfaces 675 and 680 of dielectric liner 305-c in the word line direction. Inner surfaces 675 and 680 of dielectric liner 305-c may be in contact with side surfaces 605 and 610 of top electrode 205-d. In addition, inner surfaces 675 and 680 of dielectric liner 305-c may also be in contact with side surfaces 615 and 620 of self-selecting memory component 220-d. In some cases, length 670 may be greater than length 640 and 645 of bottom electrode 210-d.

In some examples, length 635 may vary depending on the length of dielectric liner 305-c in contact with side surfaces 605 and 610 of top electrode 205-d and side surfaces 605 and 610 of self-selecting memory component 220-d. For example, an amount of dielectric liner 305-c in contact with side surface 605 of top electrode 205-d and side surface 615 of self-selecting memory component 220-d may be different than an amount of dielectric liner 305-c in contact with side surface 610 of top electrode 205-d and side surface 620 of self-selecting memory component 220-d. That is, the amount of dielectric liner 305-c in contact with side surface 605 of top electrode 205-d and side surface 615 of self-selecting memory component 220-d may be greater than the amount of dielectric liner 305-c in contact with side surface 610 of top electrode 205-d and side surface 620 of self-selecting memory component 220-d. Alternatively, the amount of dielectric liner 305-c in contact with side surface 605 of top electrode 205-d and side surface 615 of self-selecting memory component 220-d may be less than the amount of dielectric liner 305-c in contact with side surface 610 of top electrode 205-d and side surface 620 of self-selecting memory component 220-d. From the perspective of the digit line, dielectric liner 305-c may be absent from memory device 602.

Self-selecting memory component 220-d also includes bottom surface 315-c in contact with bottom electrode 210-d. In some case, the area of contact between bottom electrode 210-d and bottom surface 315-c of self-selecting memory component 220-d may be an electrode interface. In some cases, an asymmetrical electrode interface may be present between self-selecting memory component 220-d and top electrode 205-d and bottom electrode 210-d. Bottom electrode 210-d may include bottom length 645 and top length 640 in the word line direction and length 660 in the digit line direction. In some cases, bottom length 645 may be greater than top length 640. That is, the cross-section of bottom electrode 210-d may be a trapezoid in the word line direction and illustrate a tapered profile. In some cases, length 660 may be equal when measured along the top surface and bottom surface of bottom electrode 210-d in the digit line direction. That is, the cross-section of bottom electrode 210-d may be a rectangle in the digit line direction and illustrate a straight profile.

In some cases, top length 640 and bottom length 645 of bottom electrode 210-d may be less than length 630 of self-selecting memory component 220-d in the word line direction. From the perspective of the digit line, length 660 of bottom electrode 210-d may be greater than length 655 of self-selecting memory component 220-d. Such a configuration of the bottom electrode 210-d affects the size of the interface between the bottom electrode 210-d and the self-selecting memory component 220-d. The area of the interface may be less than the area of the bottom surface 315-c of the self-selecting memory component 220-d.

In some cases, bottom electrode 210-d may illustrate a tapered profile in the word line direction, the digit line direction or both. For example, bottom electrode 210-d may taper from a bottom surface in contact with word line 110-e to a top surface in contact with self-selecting memory component 220-d. The cross section of bottom electrode 210-d may be a trapezoid. Alternatively, bottom electrode 210-d may illustrate an inverted taper profile in the word line direction, the digit line direction, or both. That is, bottom electrode 210-d may taper from a top surface in contact with self-selecting memory component 220-d to a bottom surface in contact with word line 110-e. The cross section of bottom electrode 210-d may be an inverted trapezoid.

Bottom electrode 210-d may form different geometric shapes. For example, bottom electrode 210-d may be in the shape of a trapezoidal prism, and a cross-section of bottom electrode 210-d may include a trapezoid in the word line direction and a rectangle in the digit line direction. Alternatively, bottom electrode 210-d may be in the shape of an inverted trapezoidal prism, and a cross section of bottom electrode 210-d may include an inverted trapezoid in the word line direction and a rectangle in the digit line direction. In some cases, bottom electrode 210-d may be a frustum.

Top electrode 205-d may be in electronic communication with bottom electrode 210-d through self-selecting memory component 220-d. In some cases, length 625 of top electrode 205-d may be greater than top length 640 and bottom length 645 of bottom electrode 210-d in the word line direction. Alternatively, length 650 of top electrode 205-d may be less than length 660 of bottom electrode 210-d in the digit line direction. Length 635 may be greater than top length 640 and length 645 of bottom electrode 210-d in the word line direction.

The area of contact (e.g., the interface) between top surface 310-c of self-selecting memory component 220-d and top electrode 205-d may be determined by the dimensions of length 625 and length 650 of top electrode 205-d. The area of contact (e.g., the interface) between bottom surface 315-c of self-selecting memory component 220-d and bottom electrode 210-d may be determined by the dimensions of top length 640 and length 660 of bottom electrode 210-d. In some cases, the area of contact between top surface 310-c of self-selecting memory component 220-d and top electrode 205-d and the area of contact between bottom surface 315-c of self-selecting memory component 220-d and bottom electrode 210-d may be different to achieve asymmetrical electrode interfaces between top electrode 205-d and bottom electrode 210-d. For example, the area of contact between top surface 310-c of self-selecting memory component 220-d and top electrode 205-d may be greater than the area of contact between bottom surface 315-c of self-selecting memory component 220-d and bottom electrode 210-d in the word line direction.

Self-selecting memory component 220-d may mimic a tapered profile 665 due to the asymmetrical electrode interfaces. From the perspective of the word line, self-selecting memory component 220-d may mimic a tapered profile 665 such that the area of contact between top surface 310-c of self-selecting memory component 220-d and top electrode 205-d is greater than the area of contact between bottom surface 315-c of self-selecting memory component 220-d and bottom electrode 210-d. The tapered profile 665 may be from top surface 310-c to bottom surface 315-c of self-selecting memory component 220-d.

Memory cells may be read by applying a voltage across self-selecting memory component 220-d. The voltage may be applied across self-selecting memory component 220-d in a predetermined polarity (e.g., a positive polarity). The voltage may be applied to top surface 310-c or bottom surface 315-c of the self-selecting memory component 220-d. In some cases, the positive polarity voltage may be applied to the surface of self-selecting memory component 220-d with a greater area in contact with top electrode 205-d or bottom electrode 210-d. For example, the positive polarity voltage may be applied to top surface 310-c in contact with top electrode 205-d.

The threshold voltage of self-selecting memory component 220-d and/or resulting current through self-selecting memory component 220-d may depend on the location of a high resistivity region and low resistivity region within self-selecting memory component 220-d due to the distribution of ions within self-selecting memory component 220-d that may be affected by ion migration. The resistivity of the region may be based on the composition of self-selecting memory component 220-d. For example, self-selecting memory component 220-d may be a chalcogenide material.

Figure 7:
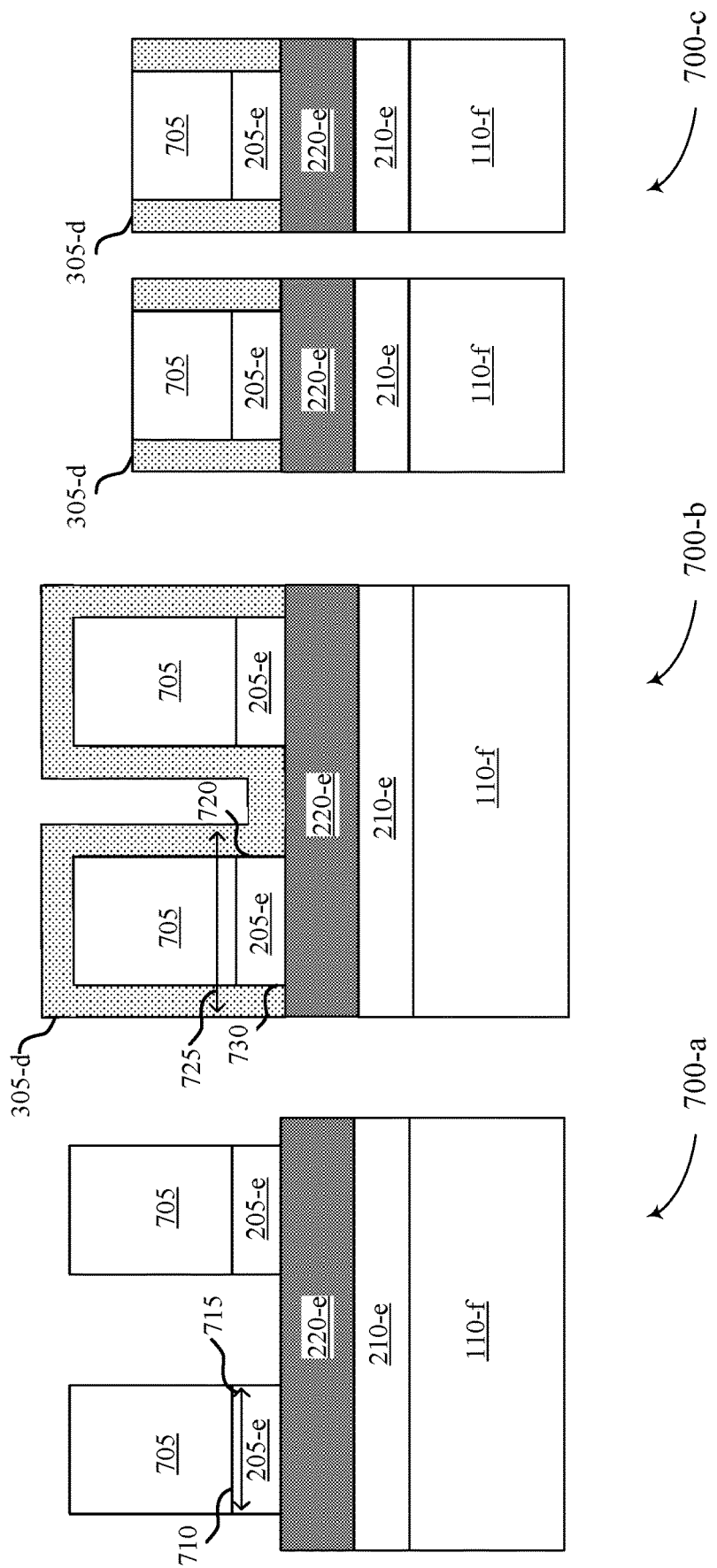
FIG. 7 illustrates an example process flow for forming a memory device that supports memory cells with asymmetrical electrode interfaces in accordance with examples of the present disclosure.

FIG. 7 illustrates an example process flow for forming a self-selecting memory device that supports memory cells with asymmetrical electrode interfaces, which may include steps 700-a, 700-b, and 700-c, in accordance with examples of the present disclosure. The resulting memory device may be an example of the memory cells and architecture that include memory devices described with reference to FIGS. 1-6. In some cases, processing steps 700-a, 700-b, and 700-c may occur in the word line direction, the digit line direction, or both.

Processing step 700-a includes formation of a stack including top electrode 205-e, bottom electrode 210-e, and self-selecting memory component 220-e. Various techniques may be used to form materials or components shown in processing step 700-a. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques.

At processing step 700-a, self-selecting memory component 220-e may be deposited above bottom electrode 210-e. Top electrode 205-e may then be deposited above self-selecting memory component 220-e such that self-selecting memory component 220-e is located between bottom electrode 210-e and top electrode 205-e. Hard mask material 705 may then be deposited on top surface 710 of top electrode 205-e. Self-selecting memory component 220-e may include a chalcogenide material.

In some examples, additional interface materials may be deposited between top electrode 205-e and self-selecting memory component 220-e, and between self-selecting memory component 220-e and top electrode 205-e. At processing step 700-a, top electrode 205-e may be etched to length 715 (e.g., first length) in the word line direction (e.g., first direction). By etching the top electrode 205-e, a size of an interface between the top electrode 205-*e* and the self-selecting memory component 220-*e* may be determined. In some cases, top electrode 205-*e* may be partially etched in the word line direction through top electrode 205-*e*. That is, the etching may stop before a top surface of self-selecting memory component 220-*e*.

At processing step 700-*b*, a deposition of dielectric liner 305-*d* may occur after the top electrode 205-*e* is deposited and etched. Dielectric liner 305-*d* may serve as a spacer for subsequent etch steps. In some examples, dielectric liner 305-*d* may be in contact with side surface 730 and side surface 720 of top electrode 205-*e*. In some cases, dielectric liner may also be in contact with one or more side surfaces of hard mask material 705 and a top surface of self-selecting memory component 220-*e*. Length 725 (e.g., second length in the first direction) may include dielectric liner 305-*d* in contact with side surfaces 730 and 720 and length 715 of top electrode 205-*e*. In some cases, length 725 may be greater than length 715 (e.g., first length) of top electrode 205-*e*.

Dielectric liner 305-*d* may be deposited using in-situ or ex-situ techniques. For example, processing steps 700-*a*, 700-*b*, and 700-*c* may occur in one processing chamber (e.g., first chamber). Alternatively, processing steps 700-*a*, 700-*b*, and 700-*c* may occur in two or more processing chambers (e.g., first, second chambers, etc.). Dielectric liner 305-*d* may be deposited using in-situ techniques. For example, top electrode 205-*e* may first be etched to length 715 (e.g., processing step 700-*a*) in a processing chamber. The etching process of top electrode 205-*e* may stop, and then dielectric liner 305-*d* may be deposited (e.g., processing step 700-*b*) in the same processing chamber. For example, dielectric liner 305-*d* may be deposited inside a first chamber. After dielectric liner 305-*d* is deposited, the etching process may resume in the same processing chamber.

Alternatively, dielectric liner 305-*d* may be deposited using ex-situ techniques. For example, top electrode 205-*e* may first be etched to length 715 in the word line direction (e.g., processing step 700-*a*) in a first processing chamber. For example, the stack including top electrode 205-*e*, bottom electrode 210-*e*, and self-selecting memory component 220-*e* may be etched to form a line inside the first processing chamber. The etching process of top electrode 205-*e* may stop, and the stack (including the etched top electrode 205-*e*) may be transferred to a second processing chamber. The second processing chamber may be different than the first processing chamber. Dielectric liner 305-*d* may then be deposited (e.g., processing step 700-*b*) in the second processing chamber. After dielectric liner 305-*d* is deposited, the stack, including dielectric liner 305-*d* deposited on top electrode 205-*e*, may be transported back to the first processing chamber to complete the etching process.

At processing step 700-*c*, the stack including top electrode 205-*e*, bottom electrode 210-*e*, and self-selecting memory component 220-*e* may be etched through dielectric liner 305-*d*, self-selecting memory component 220-*e*, bottom electrode 210-*e*, and word line 110-*f* to form a line. The line may include top electrode 205-*e*, bottom electrode 210-*e*, and self-selecting memory component 220-*e*. Processing step 700-*c* may also include the removal of dielectric liner 305-*d* from a top surface of hard mask material 705.

The etch through dielectric liner 305-*d*, self-selecting memory component 220-*e*, bottom electrode 210-*e*, and word line 110-*f* to form a line may result in a memory device with asymmetrical electrode interfaces (e.g., memory device 302 and 402 described with reference to FIGS. 3 and 4). For example, the area of contact (e.g., interface) between top electrode 205-*e* and self-selecting memory component 220-*e* may be less than the area of contact (e.g., interface) between bottom electrode 210-*e* and self-selecting memory component 220-*e*. That is, the interface between top electrode 205-*e* and self-selecting memory component 220-*e* may be narrower than the interface between bottom electrode 210-*e* and self-selecting memory component 220-*e*.

In some examples, etching through dielectric liner 305-*d*, self-selecting memory component 220-*e*, bottom electrode 210-*e*, and word line 110-*f* may form a line or a pillar comprising dielectric liner 305-*d*, self-selecting memory component 220-*e*, bottom electrode 210-*e*, and top electrode 205-*e*. The line or pillar may have a length in the digit line direction (not shown) that is greater than length 715 (e.g., first length) of top electrode 205-*e*.

The material removed at processing step 700-*c* may be removed using a number of techniques, which may include, for example, chemical etching (also referred to as "wet etching"), plasma etching (also referred to as "dry etching"), or chemical-mechanical planarization. One or more etching steps may be employed. Those skilled in the art will recognize that, in some examples, steps of a process described with a single exposure and/or etching step may be performed with separate etching steps and vice versa.

Figure 8:
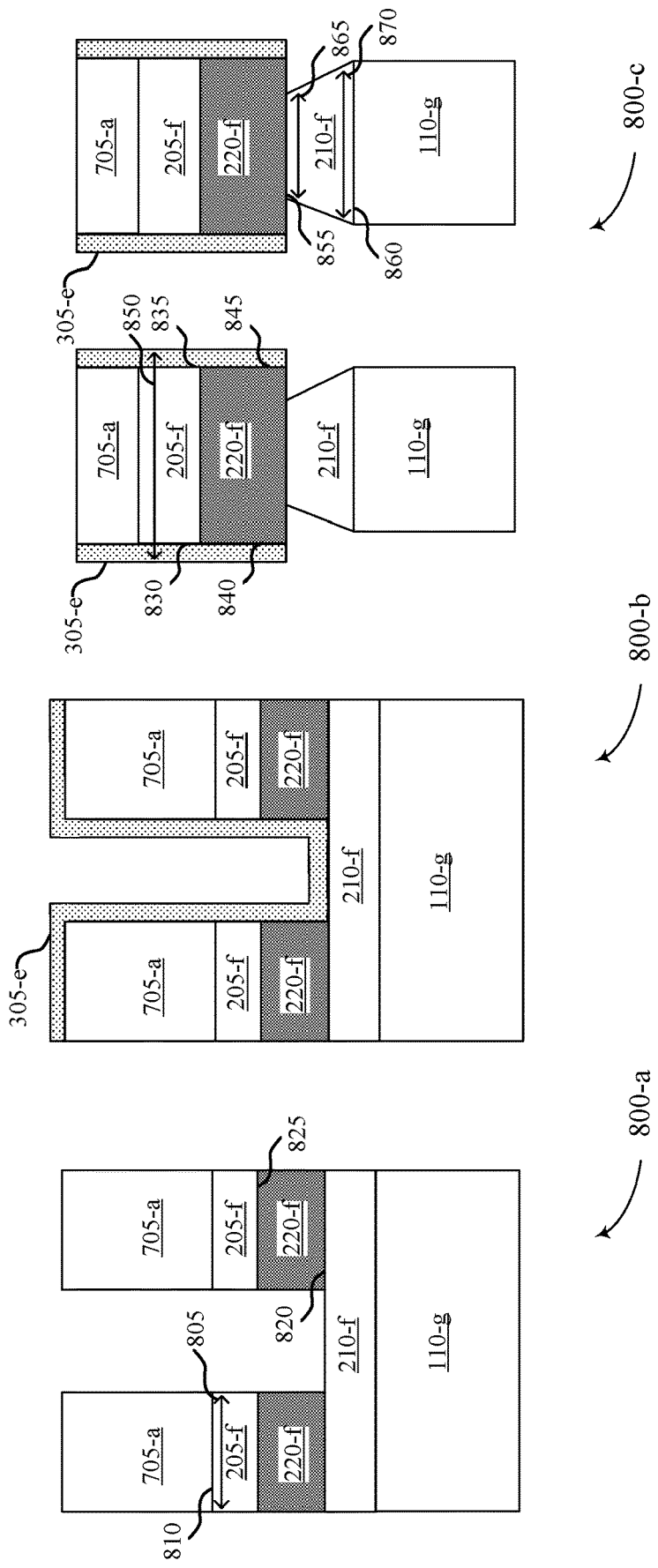
FIG. 8 illustrates an example process flow for forming a memory device that supports memory cells with asymmetrical electrode interfaces in accordance with examples of the present disclosure.

FIG. 8 illustrates an example process flow for forming a self-selecting memory device that supports memory cells with asymmetrical electrode interfaces, which may include steps 800-*a*, 800-*b*, and 800-*c*, in accordance with examples of the present disclosure. The resulting memory device may be an example of the memory cells and architecture that include memory devices described with reference to FIGS. 1-6. In some cases, processing steps 800-*a*, 800-*b*, and 800-*c* may occur in the word line direction, the digit line direction, or both.

Processing step 800-*a* includes formation of a stack including top electrode 205-*f*, bottom electrode 210-*f*, and self-selecting memory component 220-*f*. Various techniques may be used to form materials or components shown in processing step 800-*a*. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques.

At processing step 800-*a*, self-selecting memory component 220-*f* may be deposited on bottom electrode 210-*f*. Top electrode 205-*f* may then be deposited on self-selecting memory component 220-*f* such that self-selecting memory component 220-*f* is located between bottom electrode 210-*f* and top electrode 205-*f*. Hard mask material 705-*a* may then be deposited on top surface 810 of top electrode 205-*f*. Self-selecting memory component 220-*f* may include a chalcogenide material.

At processing step 800-*a*, top electrode 205-*f* may be etched to length 805 (e.g., first length) in the word line direction. In some cases, the self-selecting memory component 220-*f* may be etched along with the top electrode 205-*f* to length 805 in the word line direction. In some cases, top electrode 205-*f* and self-selecting memory component 220-*f* may be partially etched in the word line direction through top electrode 205-*f* and self-selecting memory component 220-*f*. That is, self-selecting memory component may be etched from top surface 825 to bottom surface 820.

At processing step 800-*b*, a deposition of dielectric liner 305-*e* may occur after the top electrode 205-*e* is deposited and etched. Dielectric liner 305-*e* may serve as a spacer for subsequent etch steps. In some examples, dielectric liner 305-*e* may be in contact with one or more side surfaces of top electrode 205-*f*. In some cases, dielectric liner may also be in contact with one or more side surfaces of hard mask material 705-*a*, side surfaces of self-selecting memory component 220-*f*, and a top surface of bottom electrode 210-*f*.

Dielectric liner 305-*e* may be deposited using in-situ or ex-situ techniques. For example, processing steps 800-*a*, 800-*b*, and 800-*c* may occur in one processing chamber (e.g., first chamber). Alternatively, processing steps 800-*a*, 800-*b*, and 800-*c* may occur in separate processing chambers (e.g., first, second chambers, etc.). Dielectric liner 305-*e* may be deposited using in-situ techniques. For example, top electrode 205-*f* and self-selecting memory component 220-*f* may first be etched to length 805 (e.g., processing step 800-*a*) in a processing chamber. The etching process of top electrode 205-*f* and self-selecting memory component 220-*f* may stop, and then dielectric liner 305-*e* may be deposited (e.g., processing step 800-*b*) in the same processing chamber. For example, dielectric liner 305-*e* may be deposited inside a first chamber. After dielectric liner 305-*e* is deposited, the etching process may resume in the same processing chamber.

Alternatively, dielectric liner 305-*e* may be deposited using ex-situ techniques. For example, top electrode 205-*f* and self-selecting memory component 220-*f* may first be etched to length 805 (e.g., processing step 800-*a*) in a first processing chamber. For example, the stack including top electrode 205-*f*, bottom electrode 210-*f*, and self-selecting memory component 220-*f* may be etched to form a pillar inside the first processing chamber. The etching process may stop, and the pillar may be transferred to a second processing chamber. The second processing chamber may be different than the first processing chamber. Dielectric liner 305-*e* may then be deposited (e.g., processing step 800-*b*) in the second processing chamber. After dielectric liner 305-*e* is deposited, the stack, including the dielectric liner 305-*e*, may be transported back to the first processing chamber to complete the etching process.

At processing step 800-*c*, the stack including top electrode 205-*f*, bottom electrode 210-*f*, and self-selecting memory component 220-*f* may be etched through dielectric liner 305-*e*, bottom electrode 210-*f*, and word line 110-*g* to form a line or pillar. The line or pillar may include top electrode 205-*f*, bottom electrode 210-*f*, and self-selecting memory component 220-*f*. Processing step 800-*c* may also include the removal of dielectric liner 305-*e* from a top surface of hard mask material 705-*a*.

The etch through dielectric liner 305-*e*, bottom electrode 210-*f*, and word line 110-*g* to form a line or pillar may result in a memory device with asymmetrical electrode interfaces (e.g., memory device 501 and 602 described with reference to FIGS. 5 and 6, respectively). For example, the area of contact between top electrode 205-*f* and self-selecting memory component 220-*f* may be greater than the area of contact between bottom electrode 210-*f* and self-selecting memory component 220-*f*. That is, the interface between bottom electrode 210-*f* and self-selecting memory component 220-*f* may be narrower than the interface between top electrode 205-*f* and self-selecting memory component 220-*f*.

As illustrated in processing step 800-*c*, the line or pillar may include dielectric liner in contact with side surfaces 830 and 835 of top electrode 205-*f* and side surfaces 840 and 845 of self-selecting memory component 220-*f*. Length 850 may include dielectric liner 305-*e* in contact with side surfaces 830 and 835 and length 805 of top electrode 205-*f*. In some cases, length 850 may be greater than length 805 of top electrode 205-*f*.

At processing step 800-*c*, a taper may be formed from bottom surface 860 to top surface 855 of bottom electrode 210-*f*. For example, top length 865 may be less than bottom length 870 of bottom electrode 210-*f*. The cross section of bottom electrode 210-*f* may be a trapezoid. Alternatively, bottom electrode 210-*f* may illustrate an inverted taper profile in the word line direction, the digit line direction, or both. That is, bottom electrode 210-*f* may taper from top surface 855 to bottom surface 860. The cross section of bottom electrode 210-*f* may be an inverted trapezoid. In some cases, bottom electrode 210-*f* may be formed by applying isotropic etch steps.

The material removed at processing step 800-*c* may be removed using a number of techniques, which may include, for example, chemical etching (also referred to as "wet etching"), plasma etching (also referred to as "dry etching"), or chemical-mechanical planarization. One or more etching steps may be employed. Those skilled in the art will recognize that, in some examples, steps of a process described with a single exposure and/or etching step may be performed with separate etching steps and vice versa.

Figure 9:
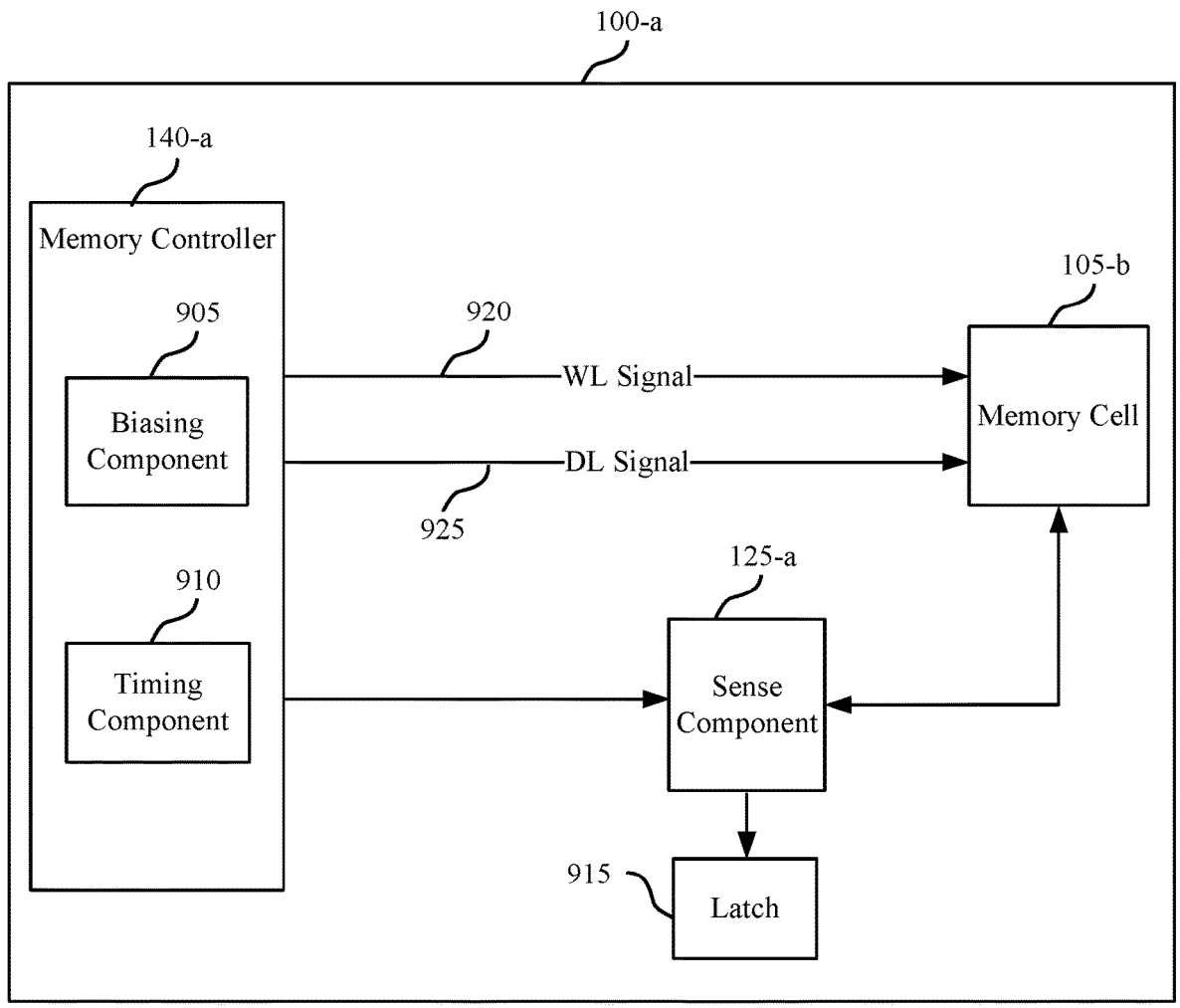
FIG. 9 illustrates an example memory array that supports memory cells with asymmetrical electrode interfaces in accordance with examples of the present disclosure.

FIG. 9 shows an example block diagram 900 of a memory array 100-*a* that supports memory cells with asymmetrical electrode interfaces in accordance with examples of the present disclosure. Memory array 100-*a* may be referred to as an electronic memory apparatus, and may be an example of a component of a memory controller 140 as described with reference to FIG. 1.

Memory array 100-*a* may include one or more memory cells 105-*b*, memory controller 140-*a*, a word line signal 920 communicated using the word line (not shown), sense component 125-*a*, digit line signal 925 communicated using a digit line (not shown), and latch 915. These components may be in electronic communication with each other and may perform one or more of the functions described herein. In some cases, memory controller 140-*a* may include biasing component 905 and timing component 910. Memory controller 140-*a* may be in electronic communication with a word line, a digit line, and sense component 125-*a*, which may be examples of word line 110, digit line 115, and sense component 125, described with reference to FIGS. 1 and 2. In some cases, sense component 125-*a* and latch 915 may be components of memory controller 140-*a*.

Memory cell 105-*b* may include a memory cell with asymmetrical electrode interfaces. For example, the self-selecting memory component may be an example of a self-selecting memory component 220 described with reference to FIGS. 2-8.

In some examples, digit line is in electronic communication with sense component 125-*a* and memory cell 105-*b*. A logic state may be written to memory cell 105-*b*. Word line may be in electronic communication with memory controller 140-*a* and memory cell 105-*b*. Sense component 125-*a* may be in electronic communication with memory controller 140-*a*, a digit line, and latch 915. These components may also be in electronic communication with other components, both inside and outside of memory array 100-*a*, in addition to components not listed above, via other components, connections, or busses.

Memory controller 140-*a* may be configured to send a word line signal 920 or digit line signal 925 by applying voltages to those various nodes. For example, biasing component 905 may be configured to apply a voltage to operate memory cell 105-*b* to read or write memory cell 105-*b* as described above. In some cases, memory controller 140-*a* may include a row decoder, column decoder, or both, as described with reference to FIG. 1. This may enable the memory controller 140-*a* to access one or more memory cells 105-*b*. Biasing component 905 may provide a voltage for the operation of sense component 125-*a*.

In some cases, memory controller 140-*a* may perform its operations using timing component 910. For example, timing component 910 may control the timing of the various word line selections or plate biasing, including timing for switching and voltage application to perform the memory functions, such as reading and writing, discussed herein. In some cases, timing component 910 may control the operations of biasing component 905.

Upon determining a logic state of memory cell 105-*b*, sense component 125-*a* may store the output in latch 915, where it may be used in accordance with the operations of an electronic device that memory array 100-*a* is a part. Sense component 125-*a* may include a sense amplifier in electronic communication with the latch and memory cell 105-*b*.

Memory controller 140-*a*, or at least some of its various sub-components may be implemented in hardware, software executed by a processor, firmware, or any combination thereof. If implemented in software executed by a processor, the functions of the memory controller 140-*a* and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The memory controller 140-*a* and/or at least some of its various sub-components may be physically located at various positions, including being distributed such that portions of functions are implemented at different physical locations by one or more physical devices. In some examples, memory controller 140-*a* and/or at least some of its various sub-components may be a separate and distinct component in accordance with various examples of the present disclosure. In other examples, memory controller 140-*a* and/or at least some of its various sub-components may be combined with one or more other hardware components, including but not limited to a receiver, a transmitter, a transceiver, one or more other components described in the present disclosure, or a combination thereof in accordance with various examples of the present disclosure.

Figure 10:
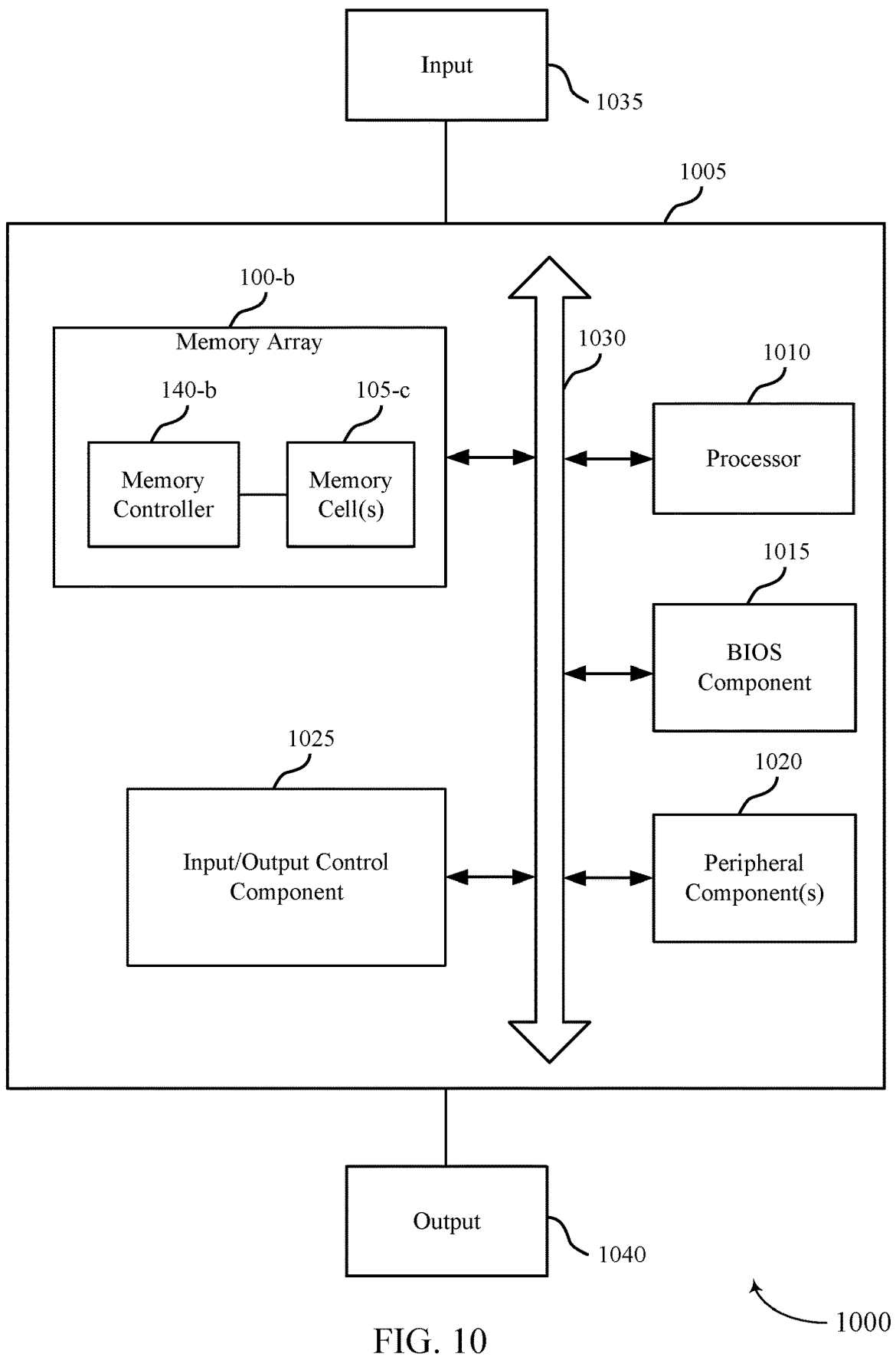
FIG. 10 illustrates a device, including a memory array, that supports memory cells with asymmetrical electrode interfaces in accordance with examples of the present disclosure.

FIG. 10 shows an example diagram of a system 1000 including a device 1005 that supports memory cells with asymmetrical electrode interfaces in accordance with various examples of the present disclosure. Device 1005 may be an example of or include the components of memory controller 140 as described above, with reference to FIG. 1. Device 1005 may include components for bi-directional voice and data communications including components for transmitting and receiving communications, including memory array 100-*b* that includes memory controller 140-*b* and memory cells 105-*c*, basic input/output system (BIOS) component 1015, processor 1010, I/O controller 1025, and peripheral components 1020. These components may be in electronic communication via one or more busses (e.g., bus 1030).

Memory cells 105-*c* may store information (i.e., in the form of a logical state) as described herein. Memory cells 105-*c* may be self-selecting memory cells with a self-selecting memory component as described with reference to FIGS. 2-8, for example.

BIOS component 1015 may be a software component that includes BIOS operated as firmware, which may initialize and run various hardware components. BIOS component 1015 may also manage data flow between a processor and various other components, for example, peripheral components, input/output control component, etc. BIOS component 1015 may include a program or software stored in read only memory (ROM), flash memory, or any other non-volatile memory.

Processor 1010 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1010 may be configured to operate a memory array using a memory controller. In other cases, a memory controller may be integrated into processor 1010. Processor 1010 may be configured to execute computer-readable instructions stored in a memory to perform various functions (e.g., functions or tasks supporting programming enhancement in self-selecting memory).

I/O controller 1025 may manage input and output signals for device 1005. I/O controller 1025 may also manage peripherals not integrated into device 1005. In some cases, I/O controller 1025 may represent a physical connection or port to an external peripheral. In some cases, I/O controller 1025 may utilize an operating system such as iOS®, ANDROID®, MS-DOS®, MS-WINDOWS®, OS/2®, UNIX®, LINUX®, or another known operating system.

Peripheral components 1020 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 1035 may represent a device or signal external to device 1005 that provides input to device 1005 or its components. This may include a user interface or an interface with or between other devices. In some cases, input 1035 may be managed by I/O controller 1025, and may interact with device 1005 via a peripheral component 1020.

Output 1040 may also represent a device or signal external to device 1005 configured to receive output from device 1005 or any of its components. Examples of output 1040 may include a display, audio speakers, a printing device, another processor or printed circuit board, etc. In some cases, output 1040 may be a peripheral element that interfaces with device 1005 via peripheral component(s) 1020. In some cases, output 1040 may be managed by I/O controller 1025.

The components of device 1005 may include circuitry designed to carry out their functions. This may include various circuit elements, for example, conductive lines, transistors, capacitors, inductors, resistors, amplifiers, or other active or inactive elements, configured to carry out the functions described herein. Device 1005 may be a computer, a server, a laptop computer, a notebook computer, a tablet computer, a mobile phone, a wearable electronic device, a personal electronic device, or the like. Or device 1005 may be a portion or component of such a device.

Figure 11:
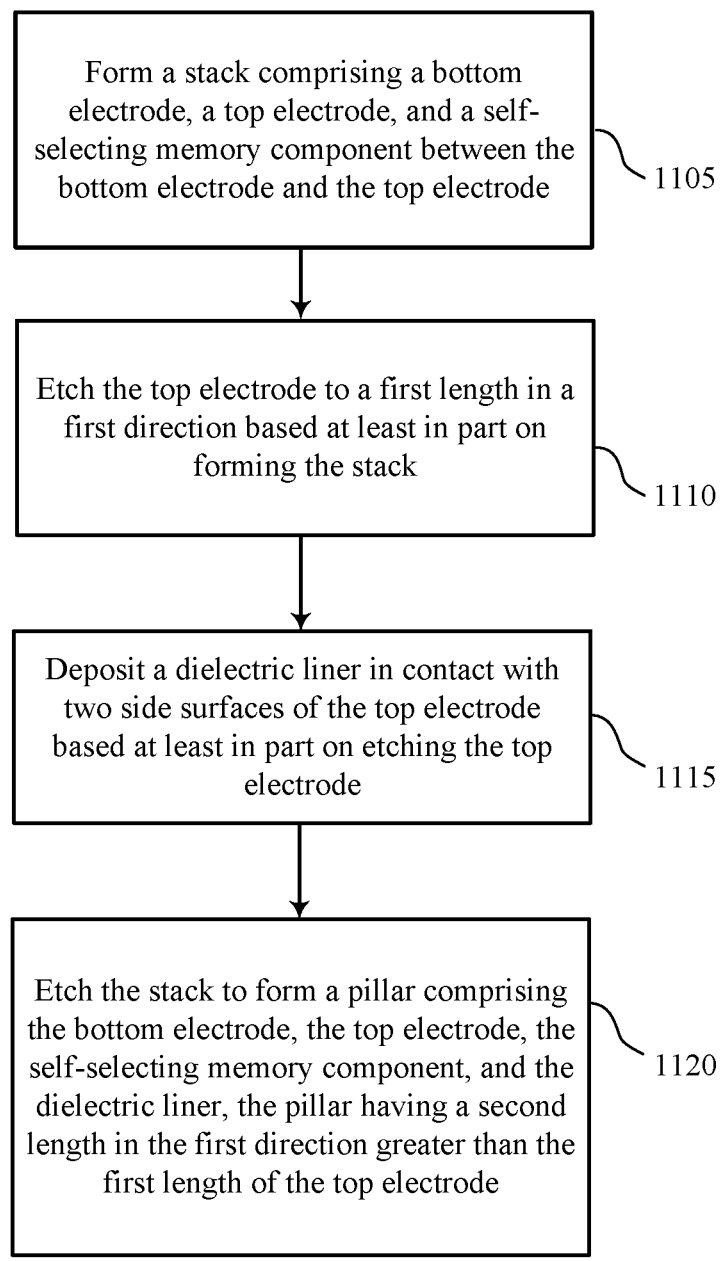
FIG. 11 is a flowchart that illustrates a method or methods for forming a memory device that supports memory cells with asymmetrical electrode interfaces in accordance with examples of the present disclosure.

FIG. 11 shows a flowchart illustrating a method 1100 to form a memory device that supports memory cells with asymmetrical electrode interfaces in accordance with examples of the present disclosure.

At block 1105 the method may include forming a stack comprising a bottom electrode, a top electrode, and a self-selecting memory component between the bottom electrode and the top electrode.

At block 1110 the method may include etching the top electrode to a first length in a first direction based at least in part on forming the stack.

At block 1115 the method may include depositing a dielectric liner in contact with two side surfaces of the top electrode based at least in part on etching the top electrode. In some examples, the dielectric liner may be deposited using an in-situ technique or an ex-situ technique.

At block 1120 the method may include etching the stack to form a pillar comprising the bottom electrode, the top electrode, the self-selecting memory component, and the dielectric liner, the pillar having a second length in the first direction greater than the first length of the top electrode.

Figure 12:
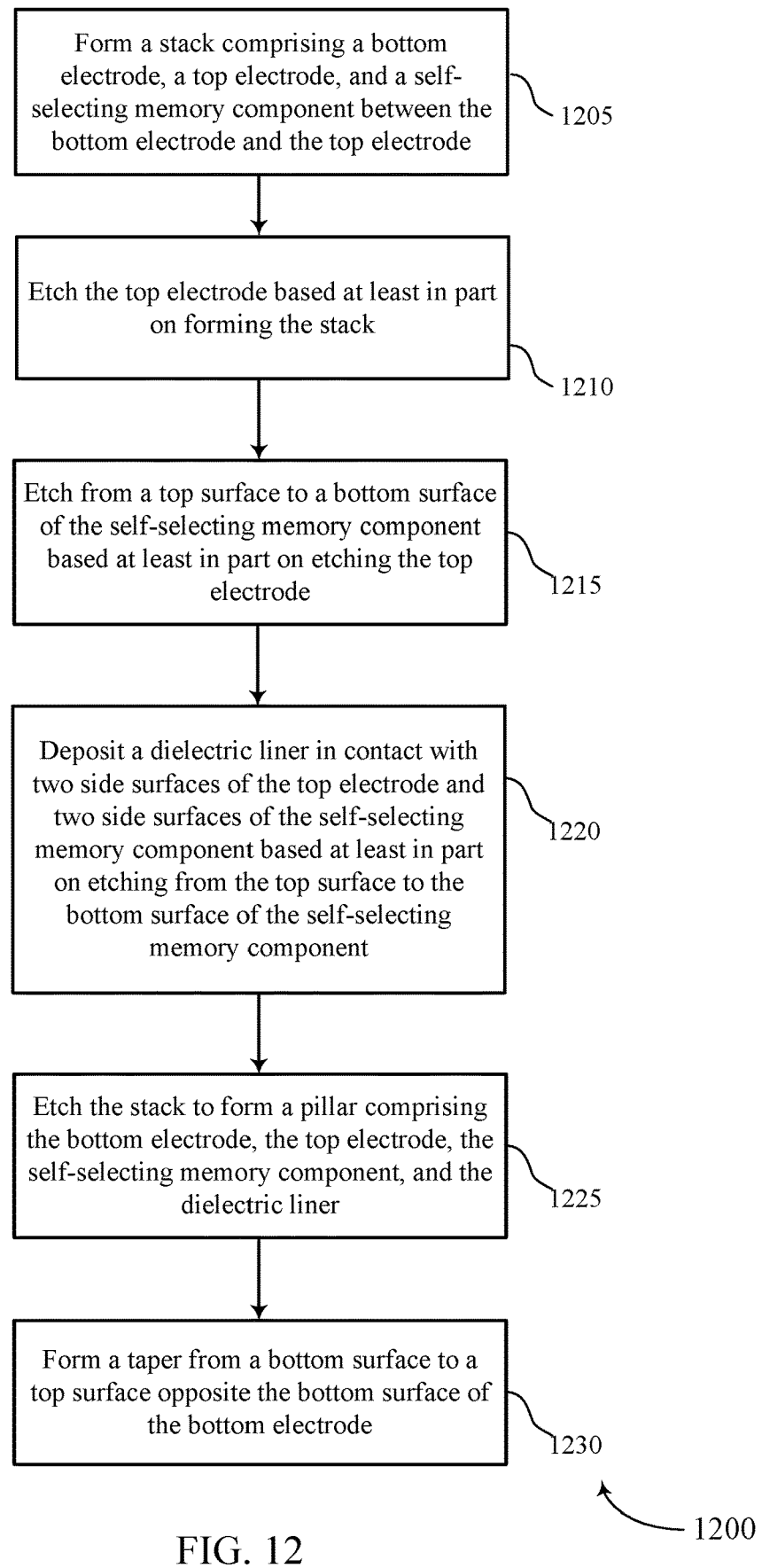
FIG. 12 is a flowchart that illustrates a method or methods for forming a memory device that supports memory cells with asymmetrical electrode interfaces in accordance with examples of the present disclosure.

FIG. 12 shows a flowchart illustrating a method 1200 to form a memory device that supports memory cells with asymmetrical electrode interfaces in accordance with examples of the present disclosure.

At block 1205 the method may include forming a stack comprising a bottom electrode, a top electrode, and a self-selecting memory component between the bottom electrode and the top electrode.

At block 1210 the method may include etching the top electrode based at least in part on forming the stack.

At block 1215 the method may include etching from a top surface to a bottom surface of the self-selecting memory component based at least in part on etching the top electrode.

At block 1220 the method may include depositing a dielectric liner in contact with two side surfaces of the top electrode and two side surfaces of the self-selecting memory component based at least in part on etching from the top surface to the bottom surface of the self-selecting memory component. In some examples, the dielectric liner may be deposited using an in-situ technique or an ex-situ technique.

At block 1225 the method may include etching the stack to form a pillar comprising the bottom electrode, the top electrode, the self-selecting memory component, and the dielectric liner.

At block 1230 the method may include forming a taper from a bottom surface to a top surface opposite the bottom surface of the bottom electrode.

While the examples described earlier focus on tapered profiles that may monotonically increase or decrease in a given direction, this is not required. For example, the desired profile/shape of a self-selecting memory component may be an hourglass shape, a barrel shape, or any other shape.

In some cases, the self-selecting memory component may be a barrel-like tapered profile. For example, when a memory cell is programmed using a given polarity, anions may drift towards one surface (e.g., a top or bottom surface) of a self-selecting memory component and cations may drift towards the opposite surface (e.g., a bottom or top surface) of the self-selecting memory component. As compared with symmetrically shaped memory cells, a self-selecting memory component that includes or mimics a barrel-like tapered profile, or another asymmetric profile in which the widths of the top and bottom surfaces of the self-selecting memory component are narrower than the width of a middle portion of the self-selecting memory component, may cause an increase in the concentrations of the cations and/or anions at the respective surfaces, by having narrow contact areas at each electrode and a larger, bulk ion reservoir at the middle of the self-selecting memory component, for example.

Figure 13:
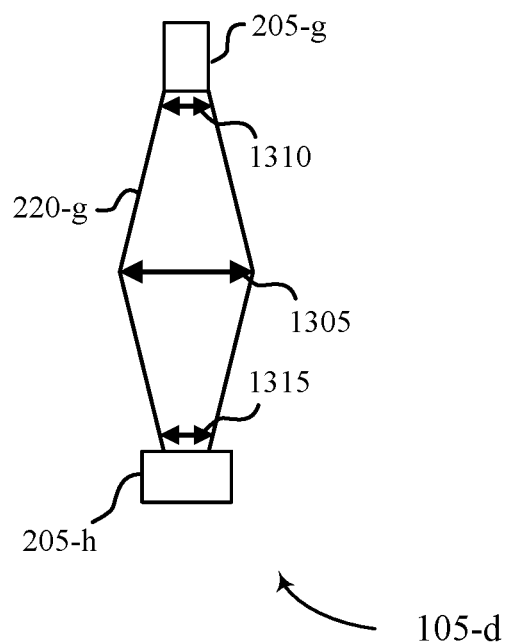
FIG. 13 illustrates example memory cells that support memory cells with asymmetrical electrode interfaces in accordance with examples of the present disclosure.
Figure 13:
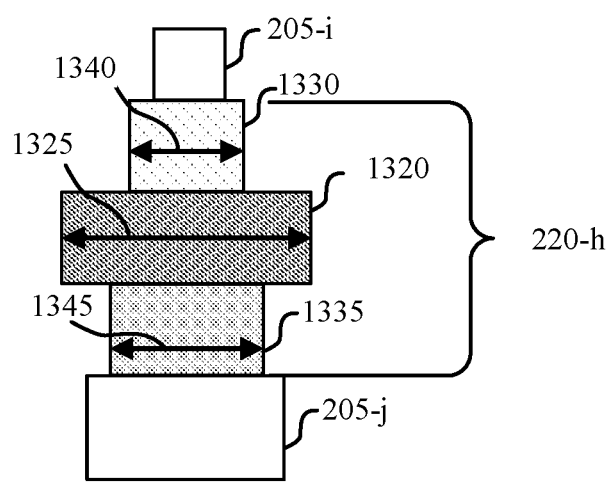

FIG. 13 illustrates example memory cells 105-*d*, 105-*e* that supports memory cells with asymmetrical electrode interfaces in accordance with examples of the present disclosure. Memory cells 105-*d*, 105-*e* provide examples of asymmetric geometries in which the widths of the top and bottom surfaces of the self-selecting memory component are narrower than the width of a middle portion of the self-selecting memory component. Memory cells 105-*d* and 105-*e* have self-selecting memory component profiles that may result in anion crowding at one surface of the self-selecting memory component and cation crowding at the opposite surface, or vice versa, depending on the polarity of the operation.

The self-selecting memory component 220-*g* of memory cell 105-*d* may be a barrel-like tapered profile, with a wider width 1305 near the middle of the self-selecting memory component 220-*g*, and narrower widths 1310, 1315 near the surfaces of the self-selecting memory component 220-*g* that are coupled with electrodes 205-*g*, 205-*h*. In some cases, the width 1110 is similar to the width 1115. In some cases, the width 1110 is different than the width 1115. Self-selecting memory component 220-*g* may be coupled to access lines via electrodes 205-*g*, 205-*h*, for example.

The self-selecting memory component 220-*h* of memory cell 105-*e* may be a stepped profile having a first (middle) portion 1320 with a wider width 1325 relative to second portion and third portions 1330, 1335 that have narrower widths 1340, 1345 near the top and bottom surfaces of self-selecting memory component 220-*h*. In this example, the second and third portions 1330, 1335 have different widths 1340, 1345. In other examples, the second and third portions 1330, 1335 may have the same widths 1340, 1345. Self-selecting memory component 220-*h* may be coupled to access lines via electrodes 205-*i*, 205-*j*, for example.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refers to a relationship between components that supports electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Chalcogenide materials may be materials or alloys that include at least one of the elements sulfur (S), selenium (Se), and tellurium (Te). Phase change materials discussed herein may be chalcogenide materials. Chalcogenide materials and alloys may include, but not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

A transistor or transistors discussed herein may represent a field-effect transistor (FET) and comprise a three-terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method of forming a memory device, comprising:
   forming a stack comprising a bottom electrode, a top electrode, and a self-selecting memory component between the bottom electrode and the top electrode;
   etching the top electrode to a first length in a first direction based at least in part on forming the stack;
   depositing a dielectric liner in contact with two side surfaces of the top electrode based at least in part on etching the top electrode; and
   etching the stack to form a line comprising the bottom electrode, the top electrode, the self-selecting memory component, and the dielectric liner, the line having a second length in the first direction greater than the first length of the top electrode.

2. The method of claim 1, further comprising:
   depositing a hard mask material on a top surface of the top electrode, wherein a portion of the hard mask material is removed when the line is formed.

3. The method of claim 1, wherein the dielectric liner is deposited using an in-situ technique or an ex-situ technique.

4. The method of claim 1, further comprising:
   etching the stack to form the line inside a first chamber, wherein depositing the dielectric liner occurs inside the first chamber.

5. The method of claim 1, further comprising:
   etching the stack to form the line inside a first chamber; and
   transferring the stack from the first chamber to a second chamber, wherein depositing the dielectric liner occurs inside the second chamber.

6. The method of claim 1, further comprising:
   etching the stack to form a pillar comprising the bottom electrode, the top electrode, the self-selecting memory component, and the dielectric liner, the pillar having a third length in a second direction greater than the first length of the top electrode.

7. The method of claim 1, wherein the top electrode is etched to the first length that is less than, or equal to a third length of the self-selecting memory component in the first direction.

8. The method of claim 1, wherein the dielectric liner is deposited in contact with two side surfaces of the top electrode, with two side surfaces of the self-selecting memory component, or with a top surface of the self-selecting memory component, or a combination thereof.

9. The method of claim 1, wherein the top electrode is etched to the first length that is less than, or equal to a third length of the bottom electrode in the first direction.

10. The method of claim 1, wherein depositing the dielectric liner is based at least in part on a third length of the dielectric liner and the first length of the top electrode being equal to a fourth length of the self-selecting memory component in the first direction.

11. A method of forming a memory device, comprising:
    forming a stack comprising a bottom electrode, a top electrode, and a self-selecting memory component between the bottom electrode and the top electrode;
    etching the top electrode based at least in part on forming the stack;
    etching from a top surface to a bottom surface of the self-selecting memory component based at least in part on etching the top electrode;
    depositing a dielectric liner in contact with two side surfaces of the top electrode and two side surfaces of the self-selecting memory component based at least in part on etching from the top surface to the bottom surface of the self-selecting memory component;
    etching the stack to form a pillar comprising the bottom electrode, the top electrode, the self-selecting memory component, and the dielectric liner; and
    forming a taper from a bottom surface to a top surface opposite the bottom surface of the bottom electrode.

12. The method of claim 11, wherein the dielectric liner is deposited using an in-situ technique or an ex-situ technique.

13. The method of claim 11, further comprising:
    etching the stack to form the pillar inside a first chamber, wherein depositing the dielectric liner occurs inside the first chamber.

14. The method of claim 11, further comprising:
    etching the stack to form the pillar inside a first chamber; and
    transferring the stack from the first chamber to a second chamber, wherein depositing the dielectric liner occurs inside the second chamber.

15. The method of claim 11, wherein the top surface of the bottom electrode is tapered to a length less than the length of the bottom surface of the self-selecting memory component.

16. A method of forming a memory device, comprising:
forming a stack comprising a bottom electrode, a top electrode, and a self-selecting memory component between the bottom electrode and the top electrode;
etching the top electrode based at least in part on forming the stack;
forming a taper from a top surface to a bottom surface opposite the top surface of the top electrode;
etching from a top surface to a bottom surface of the self-selecting memory component based at least in part on etching the top electrode;
depositing a dielectric liner in contact with two side surfaces of the self-selecting memory component based at least in part on etching from the top surface to the bottom surface of the self-selecting memory component; and
etching the stack to form a pillar comprising the bottom electrode, the top electrode, the self-selecting memory component, and the dielectric liner.

17. The method of claim 16, wherein the dielectric liner is deposited using an in-situ technique or an ex-situ technique.

18. The method of claim 16, further comprising:
etching the stack to form the pillar inside a first chamber, wherein depositing the dielectric liner occurs inside the first chamber.

19. The method of claim 16, further comprising:
etching the stack to form the pillar inside a first chamber; and
transferring the stack from the first chamber to a second chamber, wherein depositing the dielectric liner occurs inside the second chamber.

20. The method of claim 16, wherein the bottom surface of the top electrode is tapered to a length less than the length of the top surface of the self-selecting memory component.

* * * * *